United States Patent
Ahn et al.

(10) Patent No.: US 12,532,730 B2
(45) Date of Patent: Jan. 20, 2026

(54) SEMICONDUCTOR PACKAGE WITH SEMICONDUCTOR CHIPS

(71) Applicant: SAMSUNG ELECTRONICS CO., LTD., Suwon-si (KR)

(72) Inventors: Duhyoung Ahn, Suwon-si (KR); Minseok Kang, Suwon-si (KR); Sungwook Moon, Suwon-si (KR); Yongjin Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 326 days.

(21) Appl. No.: 18/213,470

(22) Filed: Jun. 23, 2023

(65) Prior Publication Data
US 2024/0105650 A1 Mar. 28, 2024

(30) Foreign Application Priority Data

Sep. 27, 2022 (KR) .................. 10-2022-0122878
Dec. 8, 2022 (KR) .................. 10-2022-0170954

(51) Int. Cl.
*H01L 23/00* (2006.01)
*H01L 23/48* (2006.01)
*H01L 23/522* (2006.01)
*H01L 25/065* (2023.01)

(52) U.S. Cl.
CPC ............ *H01L 24/06* (2013.01); *H01L 23/481* (2013.01); *H01L 23/5226* (2013.01); *H01L 24/05* (2013.01); *H01L 24/16* (2013.01); *H01L 25/0657* (2013.01); *H01L 2224/0401* (2013.01); *H01L 2224/06177* (2013.01); *H01L 2224/06515* (2013.01); *H01L 2224/16145* (2013.01); *H01L 2225/06513* (2013.01)

(58) Field of Classification Search
CPC ... H01L 24/06; H01L 23/481; H01L 23/5226; H01L 24/05
See application file for complete search history.

(56) References Cited

U.S. PATENT DOCUMENTS

| | | | |
|---|---|---|---|
| 9,496,237 B2 * | 11/2016 | Beer | ................. H01L 24/03 |
| 9,741,691 B2 | 8/2017 | Lim et al. | |
| 11,158,590 B1 | 10/2021 | Lan et al. | |
| 11,270,977 B2 * | 3/2022 | Jain | ................. H01L 25/0657 |
| 11,309,246 B2 * | 4/2022 | Dabral | ................. H05K 1/181 |
| 2012/0086111 A1 * | 4/2012 | Iwamoto | ................. H01L 24/83 |
| | | | 257/E23.033 |

(Continued)

FOREIGN PATENT DOCUMENTS

| CN | 207783252 U | * | 8/2018 | |
| CN | 110277438 A | * | 9/2019 | ............ H10D 30/60 |

(Continued)

*Primary Examiner* — Laura M Menz
(74) *Attorney, Agent, or Firm* — Sughrue Mion, PLLC

(57) ABSTRACT

Provided is a semiconductor package including a three-dimensional (3D) stacked structure in which an upper second semiconductor chip is stacked on a lower first semiconductor chip. In the semiconductor package, a power distribution network for the first semiconductor chip and a power distribution network for the second semiconductor chip are implemented through circuits of the first semiconductor chip and separated from the first semiconductor chip.

20 Claims, 14 Drawing Sheets

(56) References Cited

U.S. PATENT DOCUMENTS

| | | | | |
|---|---|---|---|---|
| 2014/0332946 A1* | 11/2014 | Oh | ........................ | H01L 23/5384 |
| | | | | 257/686 |
| 2015/0333023 A1* | 11/2015 | Beer | ........................ | H01L 24/05 |
| | | | | 257/766 |
| 2022/0139863 A1 | 5/2022 | Song et al. | | |
| 2022/0139900 A1 | 5/2022 | Oh et al. | | |
| 2022/0148988 A1 | 5/2022 | Gu et al. | | |
| 2022/0189901 A1 | 6/2022 | Gu et al. | | |
| 2024/0071845 A1* | 2/2024 | Kim | ........................ | H01L 24/16 |
| 2024/0105650 A1* | 3/2024 | Ahn | ................... | H01L 23/481 |
| 2024/0128218 A1* | 4/2024 | Chang | ................... | H01L 21/561 |
| 2024/0145360 A1* | 5/2024 | Park | ................... | H01L 23/5384 |
| 2024/0194624 A1* | 6/2024 | Kim | ................... | H01L 23/481 |
| 2024/0203960 A1* | 6/2024 | Lee | ........................ | H01L 24/08 |
| 2024/0243104 A1* | 7/2024 | Yeon | ........................ | H01L 24/83 |
| 2024/0258278 A1* | 8/2024 | Shin | ........................ | H01L 24/08 |
| 2025/0087646 A1* | 3/2025 | Chung | ............. | H01L 23/49811 |
| 2025/0105182 A1* | 3/2025 | Park | ........................ | H01L 24/06 |
| 2025/0132271 A1* | 4/2025 | Hwang | ..................... | H10D 1/68 |
| 2025/0132275 A1* | 4/2025 | Cha | ..................... | H01L 24/06 |
| 2025/0157980 A1* | 5/2025 | Seol | ........................ | H01L 24/09 |
| 2025/0219000 A1* | 7/2025 | Kang | ................... | H01L 25/0657 |
| 2025/0226374 A1* | 7/2025 | Kwon | ................... | H01L 23/481 |

FOREIGN PATENT DOCUMENTS

| | | | | | |
|---|---|---|---|---|---|
| CN | 110277438 | B | * | 7/2022 | ............. H10D 30/60 |
| DE | 102014107018 | A1 | * | 11/2015 | ......... H01L 25/0657 |
| EP | 4333033 | A1 | * | 3/2024 | ............ H01L 22/32 |
| JP | 2015018899 | A | * | 1/2015 | |
| KR | 20240044295 | A | * | 4/2024 | ............. H01L 24/14 |
| KR | 20240075020 | A | * | 5/2024 | ......... H01L 23/5389 |
| KR | 20240121132 | A | * | 8/2024 | ......... H01L 23/5286 |
| KR | 20240152586 | A | * | 10/2024 | ............ H01L 24/48 |
| KR | 20250070678 | A | * | 5/2025 | ....... H01L 23/53219 |
| TW | 202416458 | A | * | 4/2024 | ........ H01L 23/3171 |

* cited by examiner

SEMICONDUCTOR PACKAGE WITH SEMICONDUCTOR CHIPS

CROSS-REFERENCE TO RELATED APPLICATION

This application claims priority to Korean Patent Application No. 10-2022-0122878, filed on Sep. 27, 2022, and Korean Patent Application No. 10-2022-0170954, filed on Dec. 8, 2022, in the Korean Intellectual Property Office, the disclosures of which are incorporated herein by reference in their entireties.

BACKGROUND

Embodiments of the present disclosure relate to a semiconductor package, and more particularly, to a semiconductor package including a plurality of semiconductor chips.

According to the rapid development of the electronics industry and user demands, electronic devices have been further miniaturized, made multi-functional, and the capacity thereof has increased. Accordingly, a semiconductor package including a plurality of semiconductor chips is required, and recently, a semiconductor package having a three-dimensional stacked structure in which a plurality of semiconductor chips are stacked in a vertical direction has been used.

SUMMARY

One or more embodiments provide a semiconductor package including a plurality of semiconductor chips.

According to an aspect of an embodiment, there is provided a semiconductor package including a plurality of first external connection terminals configured to transfer a first power signal and a plurality of second external connection terminals configured to transfer a second power signal, a first semiconductor chip configured to receive the first power signal, the first semiconductor chip including a first interconnect layer including a plurality of first patterns electrically connected to the plurality of first external connection terminals and a plurality of second patterns electrically connected to the plurality of second external connection terminals, a second interconnect layer on the first interconnect layer, the second interconnect layer including a plurality of first mesh patterns electrically connected to the plurality of first patterns and a plurality of second mesh patterns electrically connected to the plurality of second patterns, and a third interconnect layer on the second interconnect layer, the third interconnect layer including a third pattern electrically connected to the plurality of second mesh patterns and extending in a first direction, a second semiconductor chip configured to receive the second power signal and on the first semiconductor chip, the second semiconductor chip including a fourth interconnect layer including a plurality of bump pads and a plurality of test pads, and a second substrate on the fourth interconnect layer, and a plurality of connection bumps between the first semiconductor chip and the second semiconductor chip, the plurality of connection bumps being connected to the plurality of bump pads, respectively, wherein bump pads, among the plurality of bump pads, in a pad region of the fourth interconnect layer overlapping the third pattern in a vertical direction are configured to receive power of same potential through the third pattern.

According to another aspect of an embodiment, there is provided a semiconductor package including a plurality of first external connection terminals configured to transfer a first power signal and a plurality of second external connection terminals configured to transfer a second power signal, a first semiconductor chip configured to receive the first power signal, the first semiconductor chip including a first interconnect layer including a plurality of first patterns electrically connected to the plurality of first external connection terminals and a plurality of second patterns electrically connected to the plurality of second external connection terminals, a second interconnect layer on the first interconnect layer, the second interconnect layer including a plurality of first mesh patterns electrically connected to the plurality of first patterns and a plurality of second mesh patterns electrically connected to the plurality of second patterns, a first substrate on the second interconnect layer, a plurality of through electrodes penetrating the first substrate and electrically connected to the plurality of second mesh patterns, and a third interconnect layer on the first substrate, the third interconnect layer including a third pattern electrically connected to the plurality of second mesh patterns through the plurality of through electrodes and extending in a first direction, a second semiconductor chip configured to receive the second power signal and on the first semiconductor chip, the second semiconductor chip including a fourth interconnect layer including a plurality of bump pads and a plurality of test pads, and a second substrate on the fourth interconnect layer, and a plurality of connection bumps between the first semiconductor chip and the second semiconductor chip, the plurality of connection bumps being connected to the plurality of bump pads, respectively, wherein the plurality of through electrodes have a first pitch distance in the first direction, wherein the plurality of second external connection terminals have a second pitch distance in the first direction, and wherein the first pitch distance is P times the second pitch distance, where P is a natural number.

According to another aspect of an embodiment, there is provided a semiconductor package including a plurality of first external connection terminals configured to transfer a first power signal and a plurality of second external connection terminals configured to transfer a second power signal, a first semiconductor chip configured to receive the first power signal, the first semiconductor chip including a first interconnect layer including a plurality of first patterns electrically connected to the plurality of first external connection terminals and a plurality of second patterns electrically connected to the plurality of second external connection terminals, a second interconnect layer on the first interconnect layer, the second interconnect layer including a plurality of first mesh patterns electrically connected to the plurality of first patterns and a plurality of second mesh patterns electrically connected to the plurality of second patterns, the plurality of first mesh patterns and the plurality of second mesh patterns extending in a first direction, a first substrate on the second interconnect layer, a plurality of through electrodes penetrating the first substrate, electrically connected to the plurality of second mesh patterns, and electrically insulated from the plurality of first mesh patterns, and a third interconnect layer on the first substrate, the third interconnect layer including a third pattern electrically connected to the plurality of second mesh patterns through the plurality of through electrodes and extending in the first direction, a second semiconductor chip configured to receive the second power signal and on the first semiconductor chip, the second semiconductor chip including a fourth interconnect layer including a plurality of bump pads and a plurality of test pads, and a second substrate on the fourth interconnect layer, and a plurality of connection bumps between the first semiconductor chip and the second semiconductor chip, the plurality of connection bumps being connected to the plurality of bump pads, respectively, wherein bump pads, among the plurality of bump pads, in a pad region of the fourth interconnect layer overlapping the third pattern in a vertical direction are configured to receive power of same potential through the third pattern, wherein the plurality of bump pads have a first pitch distance in the first direction, wherein the plurality of test pads have a second pitch distance in the first direction, wherein the second pitch distance is N times the first pitch distance, wherein the plurality of through electrodes have a third pitch distance in the first direction, wherein the plurality of second external connection terminals have a fourth pitch distance in the first direction, wherein the third pitch distance is P times the fourth pitch distance, where P is a natural number, wherein the plurality of through electrodes comprise a first group of through electrodes provided parallel to the first direction to form one row, and wherein each of the plurality of second external connection terminals is spaced apart in a second direction perpendicular to the first direction from a straight line connecting two adjacent through electrodes among the first group of through electrodes.

BRIEF DESCRIPTION OF DRAWINGS

Embodiments will be more clearly understood from the following detailed description taken in conjunction with the accompanying drawings in which.

DETAILED DESCRIPTION OF EMBODIMENTS

Figure 1:
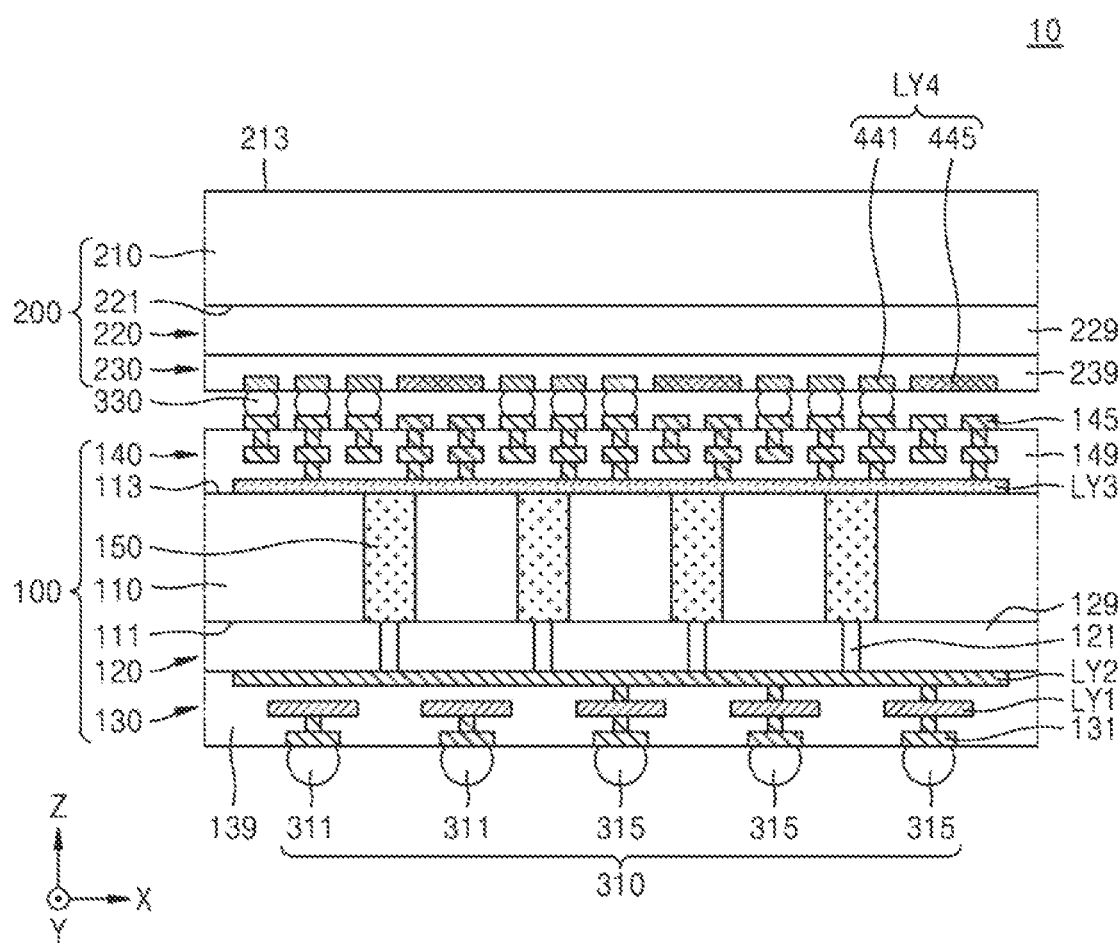
FIG. 1 is a cross-sectional view illustrating a semiconductor package according to some embodiments.

Hereinafter, some embodiments will be described in detail with reference to the accompanying drawings. The same reference numerals are used for the same components in the drawings, and redundant descriptions thereof are omitted.

Embodiments described herein are example embodiments, and thus, the disclosure is not limited thereto.

In the present specification, a vertical direction may be defined as Z direction, and a horizontal direction is defined as a direction perpendicular to the Z direction. A first horizontal direction may intersect a second horizontal direction. The first horizontal direction may be referred to as X direction, and the second horizontal direction may be referred to as Y direction. A vertical level may refer to a height level in the vertical direction. An interconnect layer may be understood to be a group of conductive elements (e.g., conductive patterns) that form a layer at substantially the same vertical level. Different interconnect layers may be arranged at vertically different levels. A horizontal width of a component may refer to a length in a horizontal direction of the component, and a line width of the component may refer to a length in a direction perpendicular to an extension direction of the component. The pitch distance may refer to the length in the horizontal direction between the centers of two neighboring components among components having a regular arrangement.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 2:
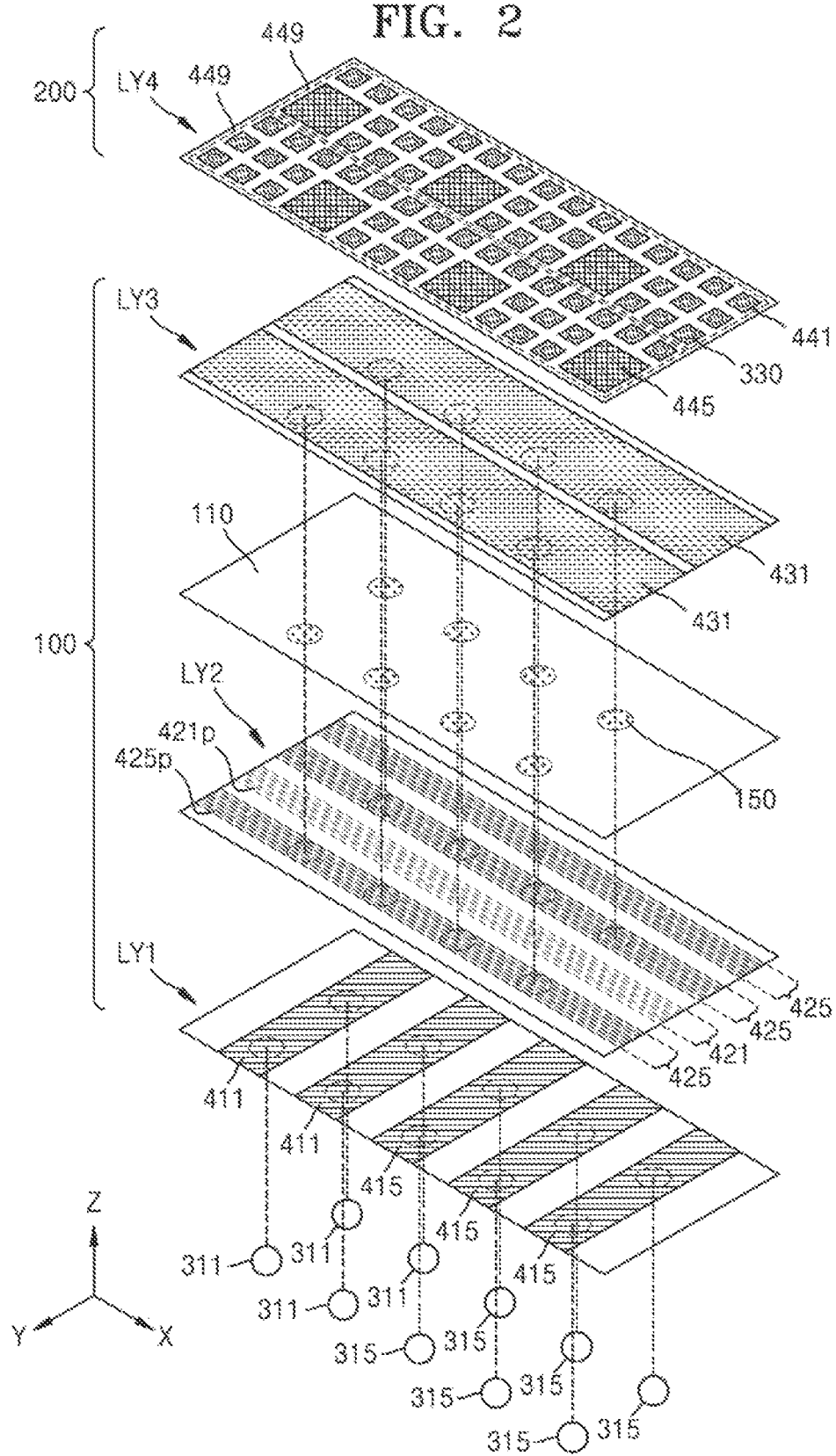
FIG. 2 is a configuration diagram illustrating a semiconductor package according to some embodiments.

FIG. 1 is a cross-sectional view illustrating a semiconductor package 10 according to some embodiments. FIG. 2 is a configuration diagram showing the semiconductor package 10 according to some embodiments.

Referring to FIG. 1 and FIG. 2, the semiconductor package 10 may include a first semiconductor chip 100, a plurality of external connection terminals 310 attached to a bottom surface of the first semiconductor chip 100, a second semiconductor chip 200 stacked on the first semiconductor chip 100, and a plurality of connection bumps 330 between the first semiconductor chip 100 and the second semiconductor chip 200.

The plurality of external connection terminals 310 may electrically and physically connect the semiconductor package 10 to an external device. The plurality of external connection terminals 310 may be attached to the bottom surface of the first semiconductor chip 100, and may be arranged in the first horizontal direction (X direction) and the second horizontal directions (Y direction) on the bottom surface of the first semiconductor chip 100. The plurality of external connection terminals 310 may be formed from solder balls and may include solder.

The plurality of external connection terminals 310 may include input/output signal terminals configured to transfer input/output signals (e.g., input/output data signals, control signals, etc.) between the first and second semiconductor chips 100 and 200 and the external device and power terminals for supplying power to devices of the first and second semiconductor chips 100 and 200. The power terminals of the plurality of external connection terminals 310 may include a plurality of first power external connection terminals 311 configured to receive a first power signal supplied to the devices of the first semiconductor chip 100 and a plurality of second power external connection terminals 315 configured to receive a second power signal supplied to the devices of the second semiconductor chip 200. The first power signal and the second power signal may each include, for example, a positive supply voltage and/or a negative supply voltage (or ground potential).

In some embodiments, the first and second semiconductor chips 100 and 200 may each comprise a logic chip and/or a memory chip. The logic chip may include a central processing unit (CPU) chip, a graphics processing unit (GPU) chip, an application processor (AP) chip, and an application specific integrated circuit (ASIC) chip. The memory chip may include a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip. The first semiconductor chip 100 and the second semiconductor chip 200 may be the same type or different types of semiconductor chips.

The first semiconductor chip 100 may include a first substrate 110, a plurality of through electrodes 150, a first device layer 120, a first lower interconnect structure 130, and a first upper interconnect structure 140.

The first substrate 110 may include an active surface and an inactive surface that are opposite to each other. The inactive surface of the first substrate 110 may correspond to a top surface 113 of the first substrate 110 facing the second semiconductor chip 200, and the active surface of the first substrate 110 may correspond to a bottom surface 111 of the first substrate 110.

The first substrate 110 may be a semiconductor substrate. The first substrate 110 may include, for example, silicon (Si). According to another embodiment, the first substrate 110 may include a semiconductor element, such as germanium (Ge) or a compound semiconductor, such as silicon carbide (SiC), gallium arsenide (GaAs), indium arsenide (InAs), and indium phosphide (InP). The first substrate 110 may include a conductive region, e.g., a well doped with impurities, or a structure doped with impurities. The first substrate 110 may also have various device isolation structures, such as a shallow trench isolation (STI) structure.

The plurality of through electrodes 150 may penetrate the first substrate 110 in a vertical direction (Z direction). Each through electrode 150 may be provided in a through hole of the first substrate 110, and a via insulation layer may be between each through electrode 150 and the first substrate 110. Each through electrode 150 may be electrically insulated from the first substrate 110 by the via insulation layer. For example, each through electrode 150 may include a pillar-shaped conductive plug and a conductive barrier layer surrounding a side wall of the conductive plug.

The first device layer 120 may be disposed below the first substrate 110. For example, the first device layer 120 may include a front end of line (FEOL) structure formed on the active surface of the first substrate 110. The first device layer 120 may include a first interlayer insulating layer 129 and first individual devices. The first individual devices may be formed in the first substrate 110 and/or on the active surface of the first substrate 110. The first individual devices may include, for example, a transistor. The first individual devices may include microelectronic devices, e.g., image sensors, such as metal-oxide-semiconductor field effect transistors (MOSFETs), large scale integration (LSI), CMOS imaging sensors (CISs), etc., micro-electro-mechanical systems (MEMSs), active devices, passive devices, and the like.

The first individual devices may be electrically connected to a conductive region of the first substrate 110. Each of the first individual devices may be electrically isolated from adjacent first individual devices by the first interlayer insulating layer 129. The first device layer 120 may include a plurality of first conductive via patterns 121 penetrating the first interlayer insulating layer 129 and electrically connected to a plurality of first through electrodes 150 in the vertical direction (Z direction).

The first lower interconnect structure 130 may be disposed below the first device layer 120. The first lower interconnect structure 130 may include a back end of line (BEOL) structure. The first lower interconnect structure 130 may include a first lower insulating layer 139 and interconnect layers of a multilayer structure that are at different levels in the first lower insulating layer 139 in the vertical direction (Z direction). The interconnect layers of the multilayer structure may be electrically connected to each other through a plurality of conductive via patterns extending in the vertical direction in the first lower insulating layer 139.

The first lower interconnect structure 130 may include a pad interconnect layer 131, a first interconnect layer LY1, and a second interconnect layer LY2 that are at different levels in the vertical direction (Z direction). In the first lower interconnect structure 130, the pad interconnect layer 131 may be a lowermost interconnect layer, and the second interconnect layer LY2 may be an uppermost interconnect layer.

The pad interconnect layer 131 may be provided on the bottom surface of the first lower interconnect structure 130. The pad interconnect layer 131 may include a plurality of external connection pads respectively coupled to a plurality of connection terminals. The bottom surface of the external connection pad may not be covered by the first lower insulating layer 139, and the corresponding external connection terminal 310 may be attached to the bottom surface of the external connection pad. The plurality of external connection pads may be arranged in the first horizontal direction (X direction) and in the second horizontal direction (Y direction). A layout of the plurality of external connection pads may be the same as a layout of the plurality of external connection terminals 310. The pitch distances of the plurality of external connection pads in the first horizontal direction (X direction) and in the second horizontal direction (Y direction) may be the same as the pitch distances of the plurality of external connection terminals 310 in the first horizontal direction (X direction) and in the second horizontal direction (Y direction), respectively.

The first interconnect layer LY1 may be disposed on the pad interconnect layer 131. The first interconnect layer LY1 may include a plurality of conductive patterns (e.g., a plurality of first conductive patterns 411 and a plurality of second conductive patterns 415). The plurality of conductive patterns may be spaced apart from each other, and each of the plurality of conductive patterns may have a linear shape extending in the horizontal direction.

The first interconnect layer LY1 may include a plurality of first conductive patterns 411 electrically connected to the plurality of first power external connection terminals 311, and a plurality of second conductive patterns 415 electrically connected to the plurality of second power external connection terminals 315. The plurality of first conductive patterns 411 may each be configured to receive the first power signal, and the plurality of second conductive patterns 415 may be each configured to receive the second power signal.

In some embodiments, the plurality of first conductive patterns 411 are spaced apart from each other in the first horizontal direction (X direction), and each of the first conductive patterns 411 may have a linear shape extending in the second horizontal direction (Y direction). In some embodiments, the plurality of second conductive patterns 415 may be spaced apart from each other in the first horizontal direction (X direction), and each of the second conductive patterns 415 may have a linear shape extending in the second horizontal direction (Y direction). Each of the first conductive pattern 411 may be electrically connected to corresponding first power external connection terminals 311 through corresponding conductive via patterns and corresponding external connection pads of the pad interconnect layer 131. In some embodiments, one of the first power external connection terminals 311 overlapping one of the first conductive patterns 411 may be electrically connected to the first conductive patterns 411 in the vertical direction (Z direction). Each of the second conductive pattern 415 may be electrically connected to corresponding second power external connection terminals 315 through corresponding conductive via patterns and corresponding external connection pads of the pad interconnect layer 131. In some embodiments, one of the second external power connection terminals 315 overlapping one of the second conductive patterns 415 may be electrically connected to the second conductive patterns 415 in the vertical direction (Z direction).

The second interconnect layer LY2 may be disposed on the first interconnect layer LY1. The second interconnect layer LY2 may include a plurality of power mesh patterns (e.g., a plurality of first power mesh patterns 421 and a plurality of second power mesh patterns 425). Each power mesh pattern may be configured to transmit power signals of the same potential, and the each power mesh pattern may include a plurality of unit line patterns. The plurality of unit line patterns may be spaced apart from each other, and each of the plurality of unit line patterns may extend in the horizontal direction. The line width of the unit line pattern may be less than the line widths of the first conductive pattern 411 and the second conductive pattern 415 included in the first interconnect layer LY1. In some embodiments, the extension direction of the plurality of power mesh patterns may intersect with the extension direction of the plurality of conductive patterns of the first interconnect layer LY1. In some embodiments, the plurality of power mesh patterns may extend in the first horizontal direction (X direction).

The second interconnect layer LY2 may include the plurality of first power mesh patterns 421 electrically connected to the plurality of first conductive patterns 411, and the plurality of second power mesh patterns 425 electrically connected to the plurality of second conductive patterns 415. The plurality of first power mesh patterns 421 may each be configured to receive the first power signal, and the plurality of second power mesh patterns 425 may each be configured to receive the second power signal. The first power mesh pattern 421 may include a plurality of first unit line patterns 421p extending in the first horizontal direction (X direction), and the plurality of first unit line patterns 421p may be spaced apart from each other in the second horizontal direction (Y direction). The second power mesh pattern 425 may include a plurality of second unit line patterns 425p extending in the first horizontal direction (X direction), and the plurality of second unit line patterns 425p may be spaced apart from each other in the second horizontal direction (Y direction). The plurality of first unit line patterns 421p forming the first power mesh pattern 421 may be electrically connected to one or more corresponding first conductive patterns 411 through corresponding conductive via patterns, and may be electrically connected to the plurality of first power external connection terminals 311 through one or more corresponding first conductive patterns 411. The plurality of second unit line patterns 425p forming the second power mesh pattern 425 may be electrically connected to one or more corresponding second conductive patterns 415 through corresponding conductive via patterns, and may be electrically connected to the plurality of second power external connection terminals 315 through one or more corresponding second conductive patterns 415.

The first upper interconnect structure 140 may be disposed on the first substrate 110. The first upper interconnect structure 140 may include a redistribution structure provided on the inactive surface of the first substrate 110. The first upper interconnect structure 140 may include an upper insulating layer 149 and interconnect layers of a multilayer structure that are at different levels in the upper insulating layer 149 in the vertical direction (Z direction). The interconnect layers of the multilayer structure may be electrically connected through the plurality of conductive via patterns extending in the vertical direction in the upper insulating layer 149.

The first upper interconnect structure 140 may include a third interconnect layer LY3 and a pad interconnect layer 145 that are at different levels in the vertical direction (Z direction). In the first upper interconnect structure 140, the third interconnect layer LY3 may be the lowermost interconnect layer, and the pad interconnect layer 145 may be the uppermost interconnect layer.

The third interconnect layer LY3 may include a plurality of third conductive patterns 431 extending on the top surface 113 of the first substrate 110. The plurality of third conductive patterns 431 may be spaced apart from each other, and the plurality of third conductive patterns 431 may each have a linear shape extending in the horizontal direction. In some embodiments, the line width of the third conductive pattern 431 may be greater than the line width of the conductive pattern of the first interconnect layer LY1.

The plurality of third conductive patterns 431 may be electrically connected to the second power mesh patterns 425 of the second interconnect layer LY2 through the plurality of through electrodes 150. The plurality of third conductive patterns 431 may be electrically insulated from first power mesh patterns 421. Each of the plurality of third conductive patterns 431 may be configured to receive the second power signal. In some embodiments, the plurality of third conductive patterns 431 may extend in a direction parallel to an extension direction of the plurality of second power mesh patterns 425. For example, the plurality of third conductive patterns 431 may be spaced apart from each other in the second horizontal direction (Y direction), and each of the plurality of third conductive patterns 431 may have a linear shape extending in the first horizontal direction (X direction).

The pad interconnect layer 145 may be provided on the top surface of the second lower interconnect structure 230. The pad interconnect layer 145 may include a plurality of connection pads coupled to the plurality of connection bumps 330. The plurality of connection pads of the pad interconnect layer 145 may each be connected to a corresponding third conductive pattern 431 of the plurality of third conductive patterns 431 through a conductive via pattern provided in the upper insulating layer 149. The plurality of connection bumps 330 may include, for example, solder.

The second semiconductor chip 200 may include a second substrate 210, a second device layer 220, and a second lower interconnect structure 230.

The second substrate 210 may include an active surface and an inactive surface that are opposite to each other. The active surface of the second substrate 210 may correspond to a bottom surface 211 of the second substrate 210 facing the first semiconductor chip 100, and the inactive surface of the second substrate 210 may correspond to a top surface 213 of the second substrate 210. The material of the second substrate 210 may be substantially the same as or similar to the material of the first substrate 110. The second substrate 210 may include a conductive region, e.g. a well doped with impurities, or a structure doped with impurities. In addition, the second substrate 210 may have various device isolation structures, such as an STI structure.

The second device layer 220 may be disposed below the second substrate 210. For example, the second device layer 220 may include an FEOL structure formed on the active surface of the second substrate 210. The second device layer 220 may include a second interlayer insulating layer 229 and second individual devices. The second individual devices may be formed in the second substrate 210 and/or on the active surface of the second substrate 210. The second individual devices may include, for example, a transistor. The second individual devices may be electrically connected to the conductive region of the second substrate 210. Each of the second individual devices may be electrically isolated from adjacent second individual devices by the second interlayer insulating layer 229.

The second lower interconnect structure 230 may be disposed below the second device layer 220. The second lower interconnect structure 230 may include a BEOL structure. The second lower interconnect structure 230 may include a second lower insulating layer 239 and interconnect layers of a multilayer structure that are at different levels in the second lower insulating layer 239 in the vertical direction (Z direction). The interconnect layers of the multilayer structure may be electrically connected through the plurality of conductive via patterns extending in the vertical direction (Z direction) in the second lower insulating layer 239.

The second lower interconnect structure 230 may include a fourth interconnect layer LY4 provided in a bottom surface of the second lower interconnect structure 230. The fourth interconnect layer LY4 may include a plurality of bump pads 441 and a plurality of test pads 445. The bottom surfaces of the plurality of bump pads 441 may not be covered by the second lower insulating layer 239, and the plurality of the bump pads 441 may be coupled to the connection bumps 330, respectively. The bottom surfaces of the plurality of test pads 445 may not be covered by the second lower insulating layer 239 and may be exposed to a gap between the first semiconductor chip 100 and the second semiconductor chip 200. The plurality of test pads 445 may be spaced apart from the plurality of bump pads 441 and the plurality of connection bumps 330 along the bottom surface of the second lower insulating layer 239. The plurality of bump pads 441 may be regularly arranged in the first horizontal direction (X direction) and the second horizontal direction (Y direction), and the plurality of test pads 445 may be regular arranged in the first horizontal direction (X direction) and the second horizontal direction (Y direction). A layout of the plurality of bump pads 441 may be the same as a layout of the plurality of connection bumps 330. The pitch distance of the plurality of bump pads 441 in the first horizontal direction (X direction) and the pitch distance thereof in the second horizontal direction (Y direction) may be the same as the pitch distance of the plurality of connection bumps 330 in the first horizontal direction (X direction) and the pitch distance thereof in the second horizontal direction (Y direction), respectively.

The plurality of test pads 445 may be pads for electrical testing of the second semiconductor chip 200. A test process may be performed by contacting test probes with the test pads 445 of the second semiconductor chip 200 before mounting the second semiconductor chip 200 onto the first semiconductor chip 100, and the second semiconductor chip 200 determined as a good product in the test process may be mounted onto the first semiconductor chip 100.

In some embodiments, the plurality of bump pads 441 may have a square shape in a plan view, and the plurality of test pads 445 may have a square shape in a plan view. In some embodiments, the horizontal width of the test pads 445 in the first horizontal direction (X direction) may be equal to or greater than the horizontal width of the bump pads 441 in the first horizontal direction (X direction). In some embodiments, the horizontal width of the test pads 445 in the second horizontal direction (Y direction) may be equal to or greater than the horizontal width of the bump pads 441 in the second horizontal direction (Y direction).

In the semiconductor package 10, the first semiconductor chip 100 and the second semiconductor chip 200 may be configured to receive power signals via different electrical paths. The first semiconductor chip 100 may be configured to receive the first power signal via an electrical path including the plurality of first power external connection terminals 311, the plurality of first conductive patterns 411 of the first interconnect layer LY1, and the plurality of first power mesh patterns 421 of the second interconnect layer LY2. That is, the plurality of first power external connection terminals 311, the plurality of first conductive patterns 411 of the first interconnect layer LY1, and the plurality of first power mesh patterns 421 of the second interconnect layer LY2 may form a power distribution network for the first semiconductor chip 100. The second semiconductor chip 200 may be configured to receive the second power signal via an electrical path including the plurality of second power external connection terminals 315, the plurality of second conductive patterns 415 of the first interconnect layer LY1, the plurality of second power mesh patterns 425 of the second interconnect layer LY2, the plurality of through electrodes 150, the plurality of third conductive patterns 431 of the third interconnect layer LY3, the plurality of connection bumps 330, and the plurality of bump pads 441 of the fourth interconnect layer LY4. That is, the plurality of second power external connection terminals 315, the plurality of second conductive patterns 415 of the first interconnect layer LY1, the plurality of second power mesh patterns 425 of the second interconnect layer LY2, the plurality of through electrodes 150, the plurality of third conductive patterns 431 of the third interconnect layer LY3, the plurality of connection bumps 330, and the plurality of bump pads 441 of the fourth interconnect layer LY4 may form a power distribution network for the second semiconductor chip 200.

Depending on a ratio of the power consumption of the first semiconductor chip 100 to the power consumption of the second semiconductor chip 200, a ratio of the density of conductive elements forming a power distribution network of the first semiconductor chip 100 to the density of conductive elements forming a power distribution network of the second semiconductor chip 200 may be determined. Here, the density may be defined as a ratio of the area of the conductive elements on the horizontal plane to the area of the horizontal plane (XY plane).

In some embodiments, depending on the ratio of the power consumption of the first semiconductor chip 100 to the power consumption of the second semiconductor chip 200, the number of first power mesh patterns 421 configured to transmit the first power signal to the first semiconductor chip 100 (or the total number of first unit line patterns 421p included in the plurality of first power mesh patterns 421) and the number of second power mesh patterns 425 configured to transmit the second power signal to the second semiconductor chip 200 (or the total number of second unit line patterns 425p included in the plurality of second power mesh patterns 425) may be determined. According to another embodiment, depending on the ratio of the power consumption of the first semiconductor chip 100 to the power consumption of the second semiconductor chip 200, a ratio of the density of the plurality of first power mesh patterns 421 to the density of the plurality of second power mesh patterns 425 may be determined. The ratio of the power consumption of the first semiconductor chip 100 to the power consumption of the second semiconductor chip 200 may be the same as a ratio of the number of first power mesh patterns 421 (or the total number of first unit line patterns 421p included in the plurality of first power mesh patterns 421) to the number of second power mesh patterns 425 (or the total number of second unit line patterns 425p included in the plurality of second power mesh patterns 425). For example, when the power consumption of the second semiconductor chip 200 is 1.5 times that of the first semiconductor chip 100, the number of second power mesh patterns 425 configured to transmit the second power signal to the second semiconductor chip 200 (or the total number of second unit line patterns 425p included in the plurality of second power mesh patterns 425) may be determined to be 1.5 times the number of first power mesh patterns 421 configured to transmit the first power signal to the first semiconductor chip 100 (or the total number of first unit line patterns 421p included in the plurality of first power mesh patterns 421).

In some embodiments, depending on the ratio of the power consumption of the first semiconductor chip 100 to the power consumption of the second semiconductor chip 200, the number of first power external connection terminals 311 configured to transmit the first power signal to the first semiconductor chip 100 and the number of second power external connection terminals 315 configured to transmit the second power signal to the second semiconductor chip 200 may be determined. The ratio of the power consumption of the first semiconductor chip 100 to the power consumption of the second semiconductor chip 200 may be the same as the ratio of the number of first power external connection terminals 311 to the number of second power external connection terminals 315. For example, when the power consumption of the second semiconductor chip 200 is 1.5 times that of the first semiconductor chip 100, the number of second power external connection terminals 315 configured to transmit the second power signal to the second semiconductor chip 200 may be determined to be 1.5 times the number of first power external connection terminals 311 configured to transmit the first power signal to the first semiconductor chip 100.

Figure 3:
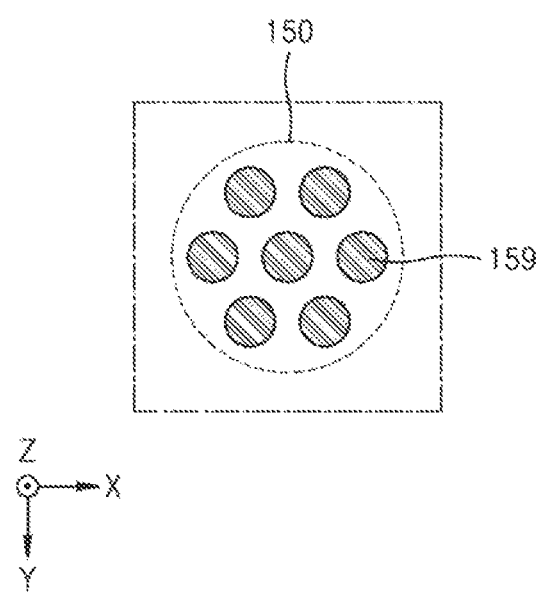
FIG. 3 is a block diagram illustrating a portion of a semiconductor package according to some embodiments.

FIG. 3 is a configuration diagram illustrating a portion of the semiconductor package 10 according to some embodiments.

Referring to FIGS. 1 to 3, each through electrode 150 may be configured as a bundle of a plurality of sub-through electrodes 159. The plurality of sub-through electrodes 159 may be configured to transmit power of the same potential, and the plurality of sub-through electrodes 159 may be electrically connected to the plurality of second unit line patterns 425p forming the second power mesh patterns 425 through the plurality of first conductive via patterns 121.

Figure 4:
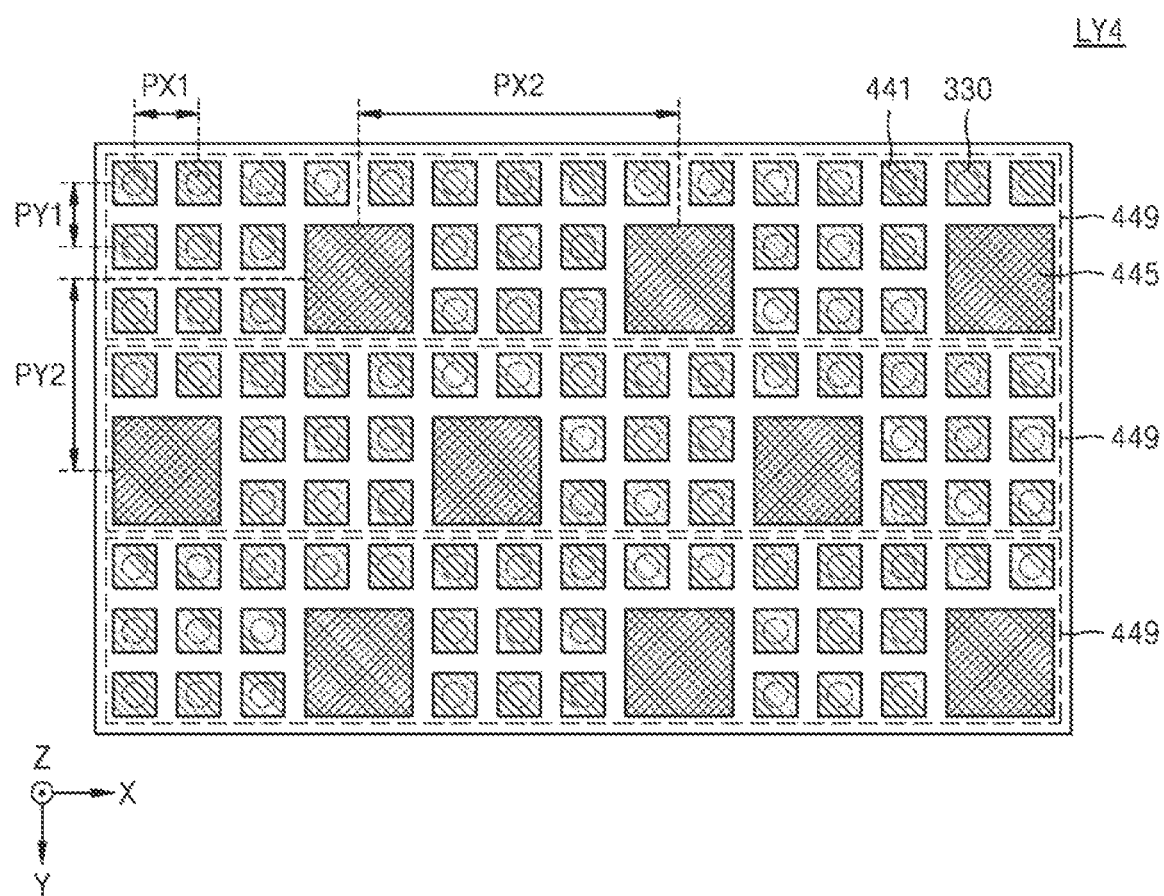
FIG. 4 is a layout diagram illustrating a fourth interconnect layer of a second semiconductor chip of a semiconductor package according to some embodiments.

FIG. 4 is a layout diagram illustrating a fourth interconnect layer LY4 of the second semiconductor chip 200 of the semiconductor package 10 according to some embodiments.

In FIGS. 1, 2 and 4, in the fourth interconnect layer LY4 of the second semiconductor chip 200, the bump pads 441 may be arranged to have an X1 pitch distance PX1 in the first horizontal direction (X direction) and a Y1 pitch distance PY1 in the second horizontal direction (Y direction), and the test pads 445 may be arranged to have an X2 pitch distance PX2 in the first horizontal direction (X direction) and a Y2 pitch distance PY2 in the second horizontal direction (Y direction).

In some embodiments, the X1 pitch distance PX1 of the bump pads 441 may be N times the X2 pitch distance PX2 of the test pads 445, where N is a natural number, and the Y1 pitch distance PY1 of the bump pads 441 may be M times the Y2 pitch distance PY2 of the test pads 445, where M is a natural number. In some embodiments, the X1 pitch distance PX1 of the bump pads 441 may be five times the X2 pitch distance PX2 of the test pads 445. In some embodiments, the Y1 pitch distance PY1 of the bump pads 441 may be three times the Y2 pitch distance PY2 of the test pads 445.

Figure 5:
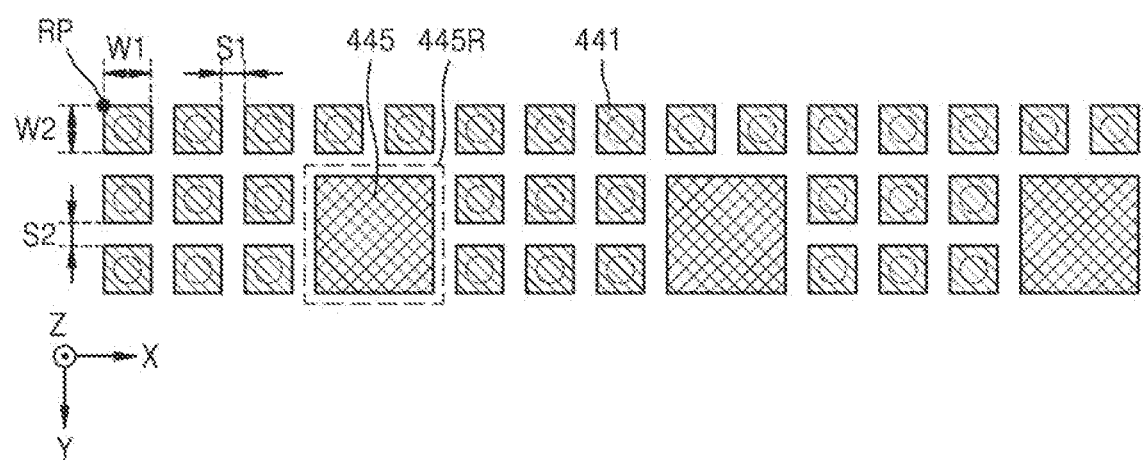
FIG. 5 is a layout diagram illustrating a fourth interconnect layer of a second semiconductor chip of a semiconductor package according to some embodiments.

FIG. 5 is a layout diagram illustrating a fourth interconnect layer LY4 of the second semiconductor chip 200 of the semiconductor package 10 according to some embodiments.

Referring to FIGS. 1, 2, 4 and 5, when the vertex of an arbitrary bump pad 441 is defined as a reference point RP of which the X-axis coordinate and the Y-axis coordinate are (0, 0), a region 445R where the test pad 445 is arranged may be defined by a first horizontal width W1 in the first horizontal direction (X direction) and a second horizontal width W2 in the second horizontal direction (Y direction) of the bump pad 441, a first distance S1 between two adjacent bump pads 441 in the first horizontal direction (X direction), a second distance S2 between two adjacent bump pads 441 in the second horizontal direction (Y direction), and the X1 pitch distance PX1 and the Y1 pitch distance PY1 of the bump pads 441.

In some embodiments, the X-axis coordinate range and the Y-axis coordinate range of the region 445R where the test pad 445 is positioned may be determined by Equations (1) and (2) below.

$$C*W1+(C-1)*S1 < X \text{ coordinate of region } 445R < C*W1+C*S1+D*PX1 \qquad \text{Equation (1)}.$$

Here, C and D are natural numbers.

$$E*W2+(E-1)*S2 < Y \text{ coordinate of region } 445R < E*W2+E*S2+F*PY1 \qquad \text{Equation (2)}$$

Here, E is an integer greater than or equal to 0, and F is a natural number.

According to some embodiments, a voltage drop (IR drop) may be reduced by regularly arranging the bump pads 441 and the test pads 445 in the first horizontal direction (X direction) and the second horizontal direction (Y direction), and interconnect layers may be designed to have a high pattern density within a limited area by arranging the bump pads 441 and the test pads 445 so that the pitch distance of the test pads 445 is a multiple of the pitch distance of the bump pads 441.

Figure 6:
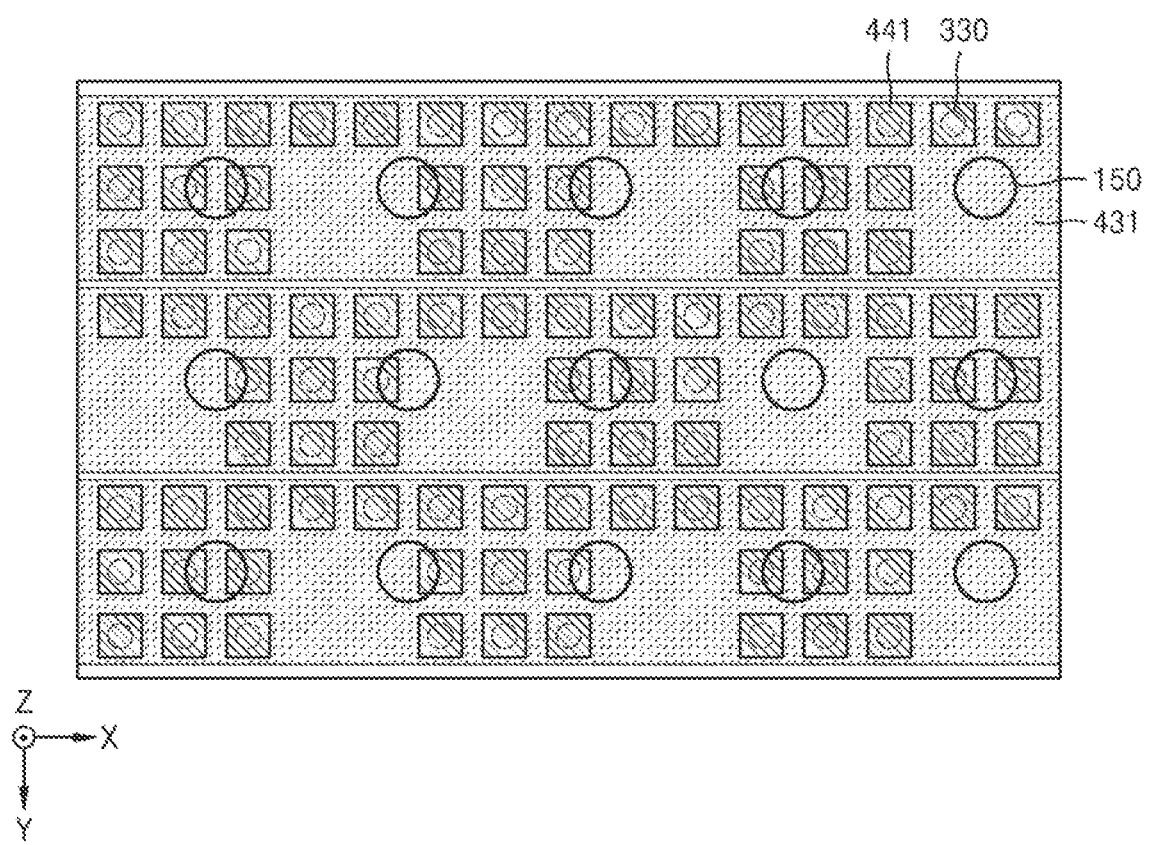
FIG. 6 is a layout diagram illustrating some components of a semiconductor package according to some embodiments.

FIG. 6 is a layout diagram illustrating some components of the semiconductor package 10 according to some embodiments. Specifically, in FIG. 6, the plurality of through electrodes 150, the plurality of third conductive patterns 431 of the third interconnect layer LY3, the plurality of connection bumps 330, and the plurality of bump pads 441 of the fourth interconnect layer LY4 are shown.

Referring to FIGS. 1, 2, and 6, between the third interconnect layer LY3 of the first semiconductor chip 100 and the fourth interconnect layer LY4 of the second semiconductor chip 200, conductive components bundled in the same power domain may be arranged to overlap in the vertical direction (Z direction).

More specifically, the fourth interconnect layer LY4 may have a plurality of pad regions 449 spaced apart from each other, and the plurality of pad regions 449 may extend in a direction parallel to the extension direction of the plurality of third conductive patterns 431 of the third interconnect layer LY3 (i.e., the first horizontal direction (X direction)). Between the third interconnect layer LY3 of the first semiconductor chip 100 and the fourth interconnect layer LY4 of the second semiconductor chip 200, single pad region 449 of the fourth interconnect layer LY4 may be overlapped with single third conductive pattern 431 of the third interconnect layer LY3 in the vertical direction (Z direction). For example, single pad region 449 of the fourth interconnect layer LY4 may be defined as a region overlapping single third conductive pattern 431 of the third interconnect layer LY3 in a vertical direction (Z direction). The pad region 449 may extend in the first horizontal direction (X direction) along the corresponding third conductive pattern 431 and may have the same or similar shape in a plan view as the corresponding third conductive pattern 431.

The plurality of bump pads 441 in the pad region 449 of the fourth interconnect layer LY4 may be configured to receive a supply voltage (e.g., a positive supply voltage or a negative supply voltage) of the same potential through the third conductive pattern 431. For example, when the specific third conductive pattern 431 is configured to receive a supply voltage (e.g., a negative supply voltage) of a first potential, the plurality of bump pads 441 in one pad region 449 of the fourth interconnect layer LY4 overlapping the specific third conductive pattern 431 may be supplied with the supply voltage of the first potential through the connection bumps 330 in the vertical direction (Z direction). For example, when the specific third conductive pattern 431 is configured to receive a supply voltage (e.g., a positive supply voltage) of a second potential, the plurality of bump pads 441 in one pad region 449 of the fourth interconnect layer LY4 overlapping the specific third conductive pattern 431 may be supplied with the supply voltage of the second potential through the connection bumps 330 in the vertical direction (Z direction).

Figure 7:
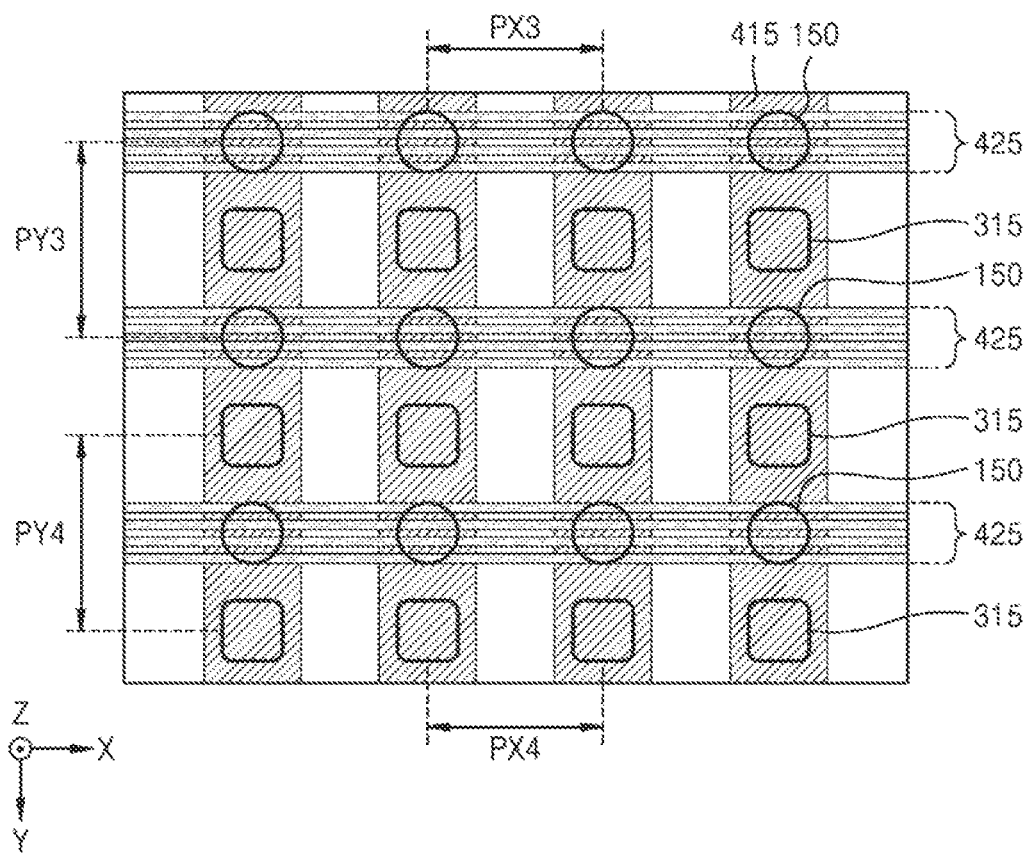
FIG. 7 is a layout diagram illustrating some components of a semiconductor package according to some embodiments.

FIG. 7 is a layout diagram illustrating some components of the semiconductor package 10 according to some embodiments. Specifically, in FIG. 7, the plurality of through electrodes 150, the plurality of second power external connection terminals 315, the plurality of second conductive patterns 415, and the plurality of second power mesh patterns 425 are shown.

Referring to FIGS. 1, 2, and 7, the plurality of through electrodes 150 are regularly arranged in the first horizontal direction (X direction) and the second horizontal direction (Y direction), and the plurality of second power external connection terminals 315 may be regularly arranged in the first horizontal direction (X direction) and the second horizontal direction (Y direction).

The plurality of through electrodes 150 may be arranged to have an X3 pitch distance PX3 in the first horizontal direction (X direction) and a Y3 pitch distance PY3 in the second horizontal direction (Y direction), and the plurality of second power external connection terminals 315 may be arranged to have an X4 pitch distance PX4 in the first horizontal direction (X direction) and a Y4 pitch distance PY4 in the second horizontal direction (Y direction).

In some embodiments, the X3 pitch distance PX3 of the through electrodes 150 may be P times the X4 pitch distance PX4 of the second power external connection terminals 315, where P is a natural number, and the Y3 pitch distance PY3 of the through electrodes 150 may be Q times the Y4 pitch distance PY4 of the second power external connection terminals 315, where Q is a natural number.

In some embodiments, the X3 pitch distance PX3 of the through electrodes 150 may be the same as the X4 pitch distance PX4 of the second power external connection terminals 315. In some embodiments, the Y3 pitch distance PY3 of the through electrodes 150 may be the same as the Y4 pitch distance PY4 of the second power external connection terminals 315.

In some embodiments, the X3 pitch distance PX3 of the through electrodes 150 and the X4 pitch distance PX4 of the second power external connection terminals 315 may each be R times the X1 pitch distance (PX1 in FIG. 4) of the bump pads 441, where R is a natural number. In some embodiments, the X3 pitch distance PX3 of the through electrodes 150 and the X4 pitch distance PX4 of the second power external connection terminals 315 may each be three times the X1 pitch distance (PX1 in FIG. 4) of the bump pads 441. In some embodiments, the Y3 pitch distance PY3 of the through electrodes 150 and the Y4 pitch distance PY4 of the second power external connection terminals 315 may each be S times the Y1 pitch distance (PY1 in FIG. 4) of the bump pads 441, where S is a natural number. In some embodiments, the Y3 pitch distance PY3 of the through electrodes 150 and the Y4 pitch distance PY4 of the second power external connection terminals 315 may each be three times the Y1 pitch distance (PY1 in FIG. 4) of the bump pads 441.

Figure 8:
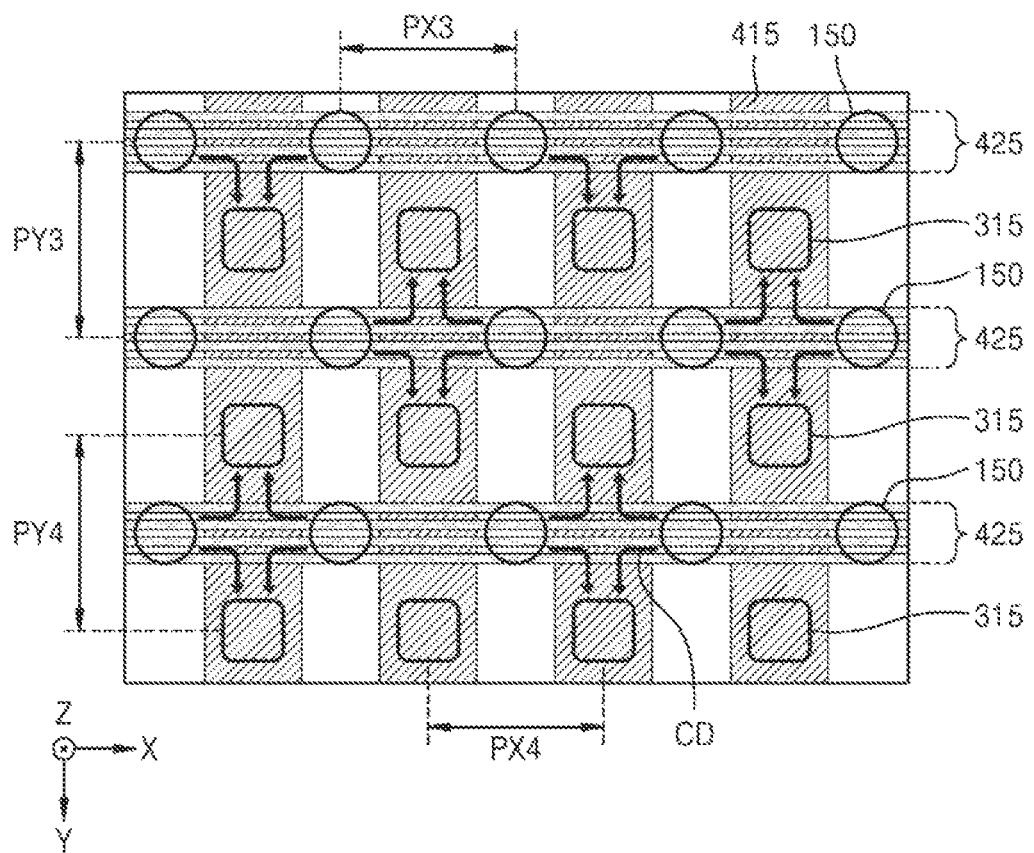
FIG. 8 is a layout diagram illustrating some components of a semiconductor package according to some embodiments.

FIG. 8 is a layout diagram illustrating some components of the semiconductor package 10 according to some embodiments. Specifically, in FIG. 8, the plurality of through electrodes 150, the plurality of second power external connection terminals 315, the plurality of second conductive patterns 415, and the plurality of second power mesh patterns 425 are shown.

Referring to FIGS. 1, 2, and 8, the plurality of through electrodes 150 and the plurality of second electric power external connection terminals 315 may be arranged not to overlap each other in the vertical direction (Z direction). In some embodiments, in a plan view, the second power external connection terminal 315 may not be disposed between two adjacent through electrodes 150 in the first horizontal direction (X direction). In other words, in a plan view, the plurality of second power external connection terminals 315 may be spaced apart in the second horizontal direction (Y direction) from a straight line connecting the centers of the two adjacent through electrodes 150 in the first horizontal direction (X direction). For example, the plurality of second power external connection terminals 315 do not overlap any of the through electrodes 150 in the first horizontal direction (X direction). According to another embodiment, in a plan view, the centers of the plurality of second power external connection terminals 315 may be spaced apart in the second horizontal direction (Y direction)

from the straight line connecting the centers of the two adjacent through electrodes 150 in the first horizontal direction (X direction).

In some embodiments, in a plan view, one through electrode 150 may be disposed on the center points of four adjacent second power external connection terminals 315 in two diagonal directions perpendicular to each other (i.e., diagonal directions for the first horizontal direction (X direction) and the second horizontal direction (Y direction)). In some embodiments, in a plan view, one second power external connection terminal 315 may be disposed on the center points of four adjacent through electrodes 150 in two diagonal directions perpendicular to each other (i.e., diagonal directions for the first horizontal direction (X direction) and the second horizontal direction (Y direction)).

A group of through electrodes 150, among the plurality of through electrodes 150, arranged along a first straight line parallel to the first horizontal direction (X direction) to form one row may be defined as a first group of through electrodes 150. The first group of through electrodes 150 may be electrically connected to a second power mesh pattern 425 and may be arranged to overlap the second power mesh pattern 425 in the vertical direction (Z direction). In addition, among the plurality of second power external connection terminals 315, a plurality of second power external connection terminals 315 arranged along a second straight line parallel to the second horizontal direction (Y direction) to form one column may be defined as a first group of second power external connection terminals 315. The first group of second power external connection terminals 315 may be electrically connected to a second conductive pattern 415 and may be positioned to overlap the second conductive pattern 415 in the vertical direction (Z direction).

In a plan view, each of the plurality of second power external connection terminals 315 may be spaced apart in the second horizontal direction (Y direction) from a straight line connecting two adjacent through electrodes 150 in the first horizontal direction (X direction) among the first group of through electrodes 150.

Figure 9:
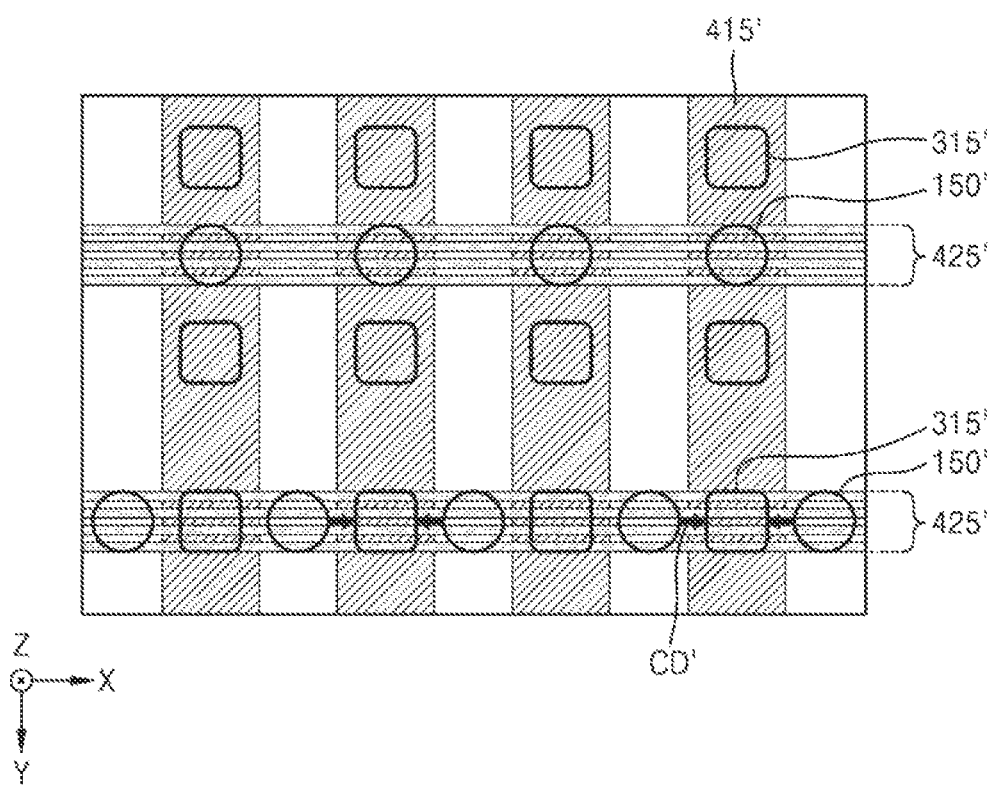
FIG. 9 is a layout diagram illustrating some components of a semiconductor package according to a comparative example.

FIG. 9 is a layout diagram showing some components of the semiconductor package according to a related example. Specifically, a plurality of through electrodes 150', a plurality of second power external connection terminals 315', a plurality of second conductive patterns 415', and a plurality of second power mesh patterns 425' are shown in FIG. 9.

Referring to FIG. 9, in the semiconductor package according to the related example, the plurality of through electrodes 150' arranged along a first straight line parallel to the first horizontal direction (X direction) to form one row may be defined as a first group of through electrodes 150'. In a plan view, one second power external connection terminal 315' is positioned between two adjacent through electrodes 150' among the first group of through electrodes 150'. In this case, as indicated by an arrow CD' in FIG. 9, current may be concentrated on the second external connection terminals 310' arranged between two adjacent through electrodes 150' among the first group of through electrodes 150', thereby causing defects such as electromigration (EM).

However, according to some embodiments, as indicated in FIG. 8, the pitch distance of the through electrodes 150 may be a multiple of the pitch distance of the second power external connection terminals 315, and the second power external connection terminals 315 may be spaced apart in the second horizontal direction (Y direction) from straight lines connecting the first group of through electrodes 150 extending in the first horizontal direction (X direction) to form one row. In this case, as indicated by an arrow CD' in FIG. 8, the current is evenly distributed from each of the two adjacent through electrodes 150 among the first group of through electrodes 150 to the two adjacent second power external connection terminals 315 in the second horizontal direction (Y direction), thereby preventing defects such as EM.

Figure 10:
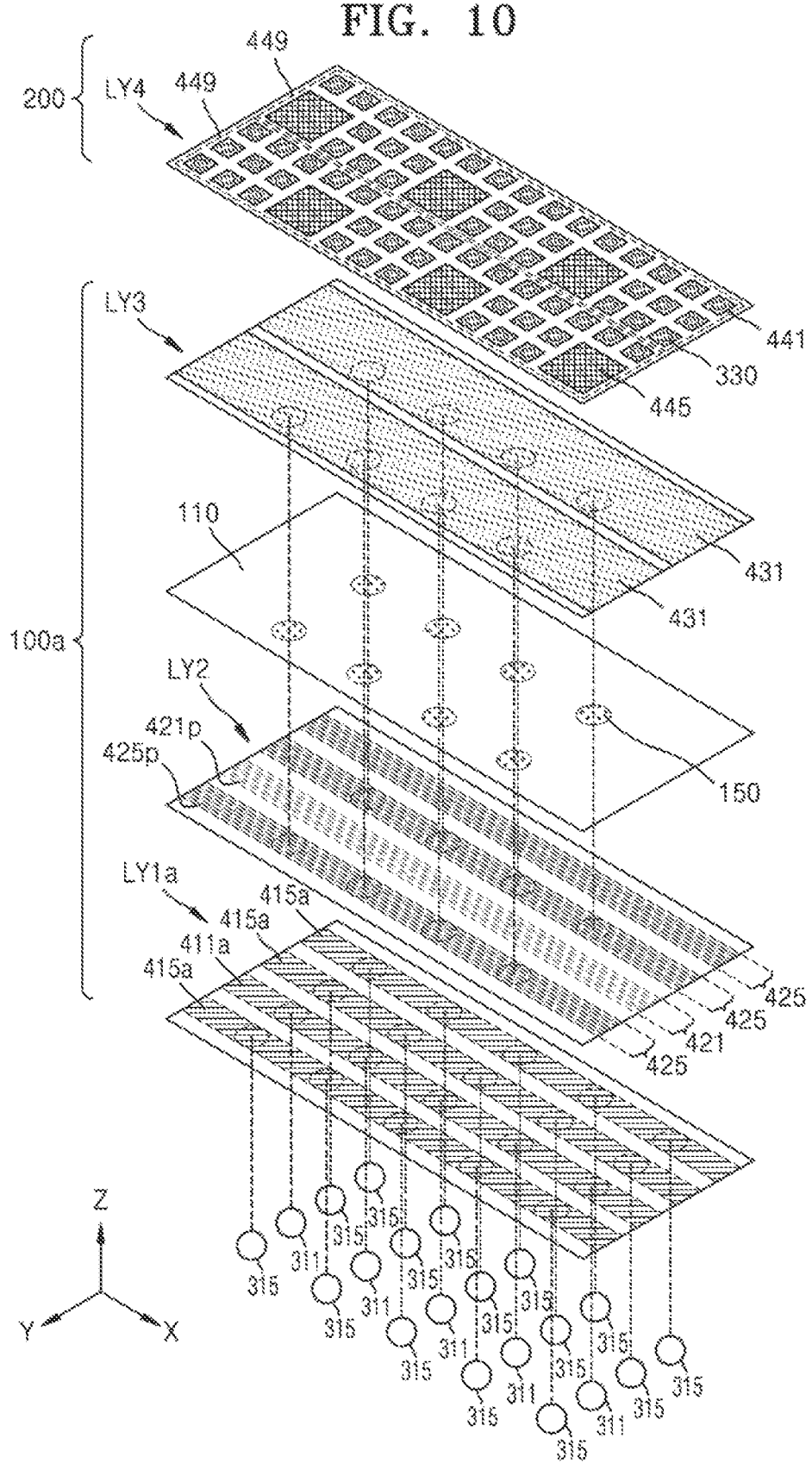
FIG. 10 is a configuration diagram illustrating some components of a semiconductor package according to some embodiments.

FIG. 10 is a configuration diagram illustrating some components of the semiconductor package according to some embodiments. Hereinafter, the semiconductor package shown in FIG. 10 will be described, focusing on differences from the semiconductor package 10 described with reference to FIGS. 1 and 2.

Referring to FIG. 10, in the first semiconductor chip 100*a* of the semiconductor package, an extension direction of a plurality of conductive patterns (e.g., a plurality of first conductive patterns 411*a* and a plurality of second conductive patterns 415*a*) of a first interconnect layer LY1*a* may be parallel to an extension direction of the plurality of power mesh patterns (e.g., the plurality of first power mesh patterns 421 and the plurality of second power mesh patterns 425) of the second semiconductor chip 200. For example, the plurality of first conductive patterns 411*a* may be spaced apart from each other in the second horizontal direction (Y direction), and each of the plurality of first conductive patterns 411*a* may have a linear shape extending in the first horizontal direction (X direction). For example, the plurality of second conductive patterns 415*a* may be spaced apart from each other in the second horizontal direction (Y direction), and each of the plurality of second conductive patterns 415*a* may have a linear shape extending in the first horizontal direction (X direction). In some embodiments, in a plan view, an area occupied by the specific first conductive pattern 411*a* may overlap the first power mesh pattern 421 electrically connected to the specific first conductive pattern 411*a*. In some embodiments, in a plan view, an area occupied by the specific second conductive pattern 415*a* may overlap the second power mesh pattern 425 electrically connected to the specific second conductive pattern 415*a* in the vertical direction (Z direction).

Figure 11:
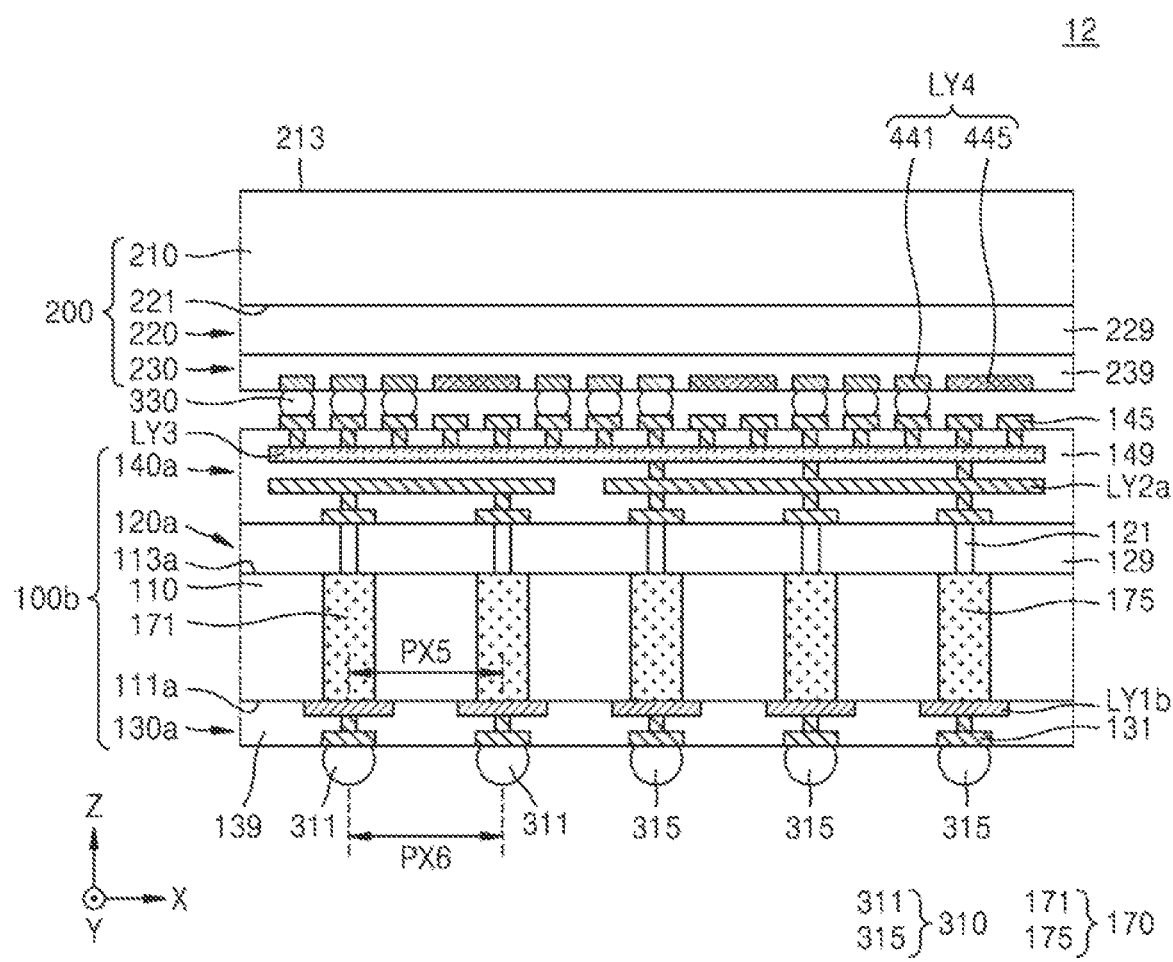
FIG. 11 is a cross-sectional view illustrating a semiconductor package according to some embodiments.
Figure 12:
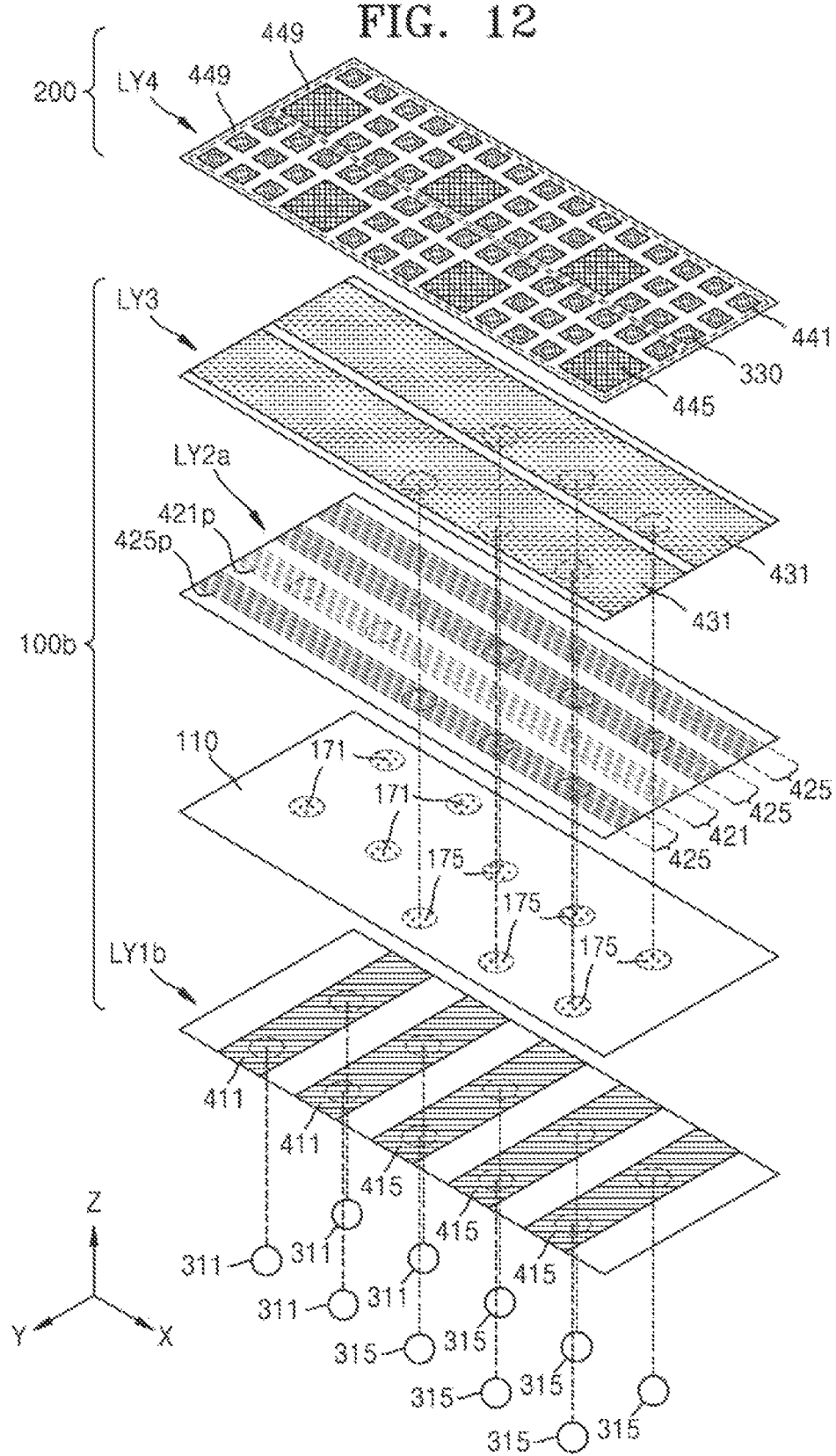
FIG. 12 is a configuration diagram illustrating a semiconductor package according to some embodiments.

FIG. 11 is a cross-sectional view illustrating a semiconductor package 12 according to some embodiments. FIG. 12 is a configuration diagram showing the semiconductor package 12 according to some embodiments. Hereinafter, the semiconductor package 12 shown in FIGS. 11 and 12 will be described, focusing on differences from the semiconductor package 10 described with reference to FIGS. 1 and 2.

Referring to FIGS. 11 and 12, the semiconductor package 12 may include a first semiconductor chip 100*b*, a plurality of external connection terminals 310 attached to a bottom surface of the first semiconductor chip 100*b*, a second semiconductor chip 200 stacked on the first semiconductor chip 100*b*, and a plurality of connection bumps 330 between the first semiconductor chip 100*b* and the second semiconductor chip 200.

In the first semiconductor chip 100*b* of the semiconductor package 12, the top surface 113*a* of the first substrate 110 may be an active surface of the first substrate 110, and the bottom surface 111*a* of the first substrate 110 may be an inactive surface of the first substrate 110. In the semiconductor package 12, the active surface of the first semiconductor chip 100*b* may face an active surface of the second semiconductor chip 200.

The first semiconductor chip 100*b* may include a first lower interconnect structure 130*a* disposed below the first substrate 110, a first device layer 120*a* disposed on the top surface 113*a* of the first substrate 110, and a first upper interconnect structure 140*a* disposed on the first device layer 120a. The first lower interconnect structure 130a may include a redistribution structure provided on the inactive surface of the first substrate 110, and the first upper interconnect structure 140a may include a BEOL structure provided on the active surface of the first substrate 110.

The first lower interconnect structure 130a may include a first lower insulating layer 139 and interconnect layers of a multilayer structure that are at different levels within the first lower insulating layer 139 in a vertical direction (Z direction). The first lower interconnect structure 130a may include a pad interconnect layer 131 and a first interconnect layer LY1b on the pad interconnect layer 131. The pad interconnect layer 131 may include a plurality of external connection pads to which the plurality of external connection terminals 310 are coupled. The first interconnect layer LY1b may include a plurality of first conductive patterns 411 electrically connected to the plurality of first power external connection terminals 311, and a plurality of second conductive patterns 415 electrically connected to the plurality of second power external connection terminals 315.

A plurality of through electrodes 170 may include a plurality of first through electrodes 171 connected to the plurality of first conductive patterns 411 and a plurality of second through electrodes 175 electrically connected to the plurality of second conductive patterns 415. The plurality of second through electrodes 175 are components of the power distribution network for the second semiconductor chip 200, and are substantially the same as the through electrodes 150 described with reference to FIGS. 1 and 2, whereby redundant descriptions are omitted.

The first upper interconnect structure 140a may include a second interconnect layer LY2a, a third interconnect layer LY3, and a pad interconnect layer 145 disposed at different levels in the vertical direction (Z direction). Among the second interconnect layer LY2a, the third interconnect layer LY3, and the pad interconnect layer 145, the second interconnect layer LY2a may be a lowermost interconnect layer and the pad interconnect layer 145 may be an uppermost interconnect layer. The pad interconnect layer 145 may include a plurality of connection pads coupled to the plurality of connection bumps 330.

The second interconnect layer LY2a may include a plurality of first power mesh patterns 421 configured to transmit the first power signal and a plurality of second power mesh patterns 425 configured to transmit the second power signal. The plurality of first power mesh patterns 421 may be electrically connected to the plurality of first conductive patterns 411 through the plurality of first through electrodes 171, and may be configured to receive the first power signal through the plurality of first through electrodes 171 and the plurality of first conductive patterns 411. The plurality of second power mesh patterns 425 may be electrically connected to the plurality of second conductive patterns 415 through the plurality of second through electrodes 175, and may be configured to receive the second power signal through the plurality of second through electrodes 175 and the plurality of second conductive patterns 415.

The third interconnect layer LY3 may include a plurality of third conductive patterns 431. The plurality of third conductive patterns 431 may be electrically connected to the plurality of second power mesh patterns 425 and electrically separated from the plurality of first power mesh patterns 421. The plurality of third conductive patterns 431 may be configured to receive the second power signal through the plurality of second power mesh patterns 425. In some embodiments, the plurality of first power mesh patterns 421 may be electrically connected to the conductive patterns provided in the third interconnect layer LY3.

In some embodiments, the plurality of conductive patterns (i.e., the plurality of first conductive patterns 411 and the plurality of second conductive patterns 415) of the first interconnect layer LY1b may extend in the second horizontal direction (Y direction), the plurality of power mesh patterns (i.e., the plurality of first power mesh patterns 421 and the plurality of second power mesh patterns 425) of the second interconnect layer LY2a may extend in the first horizontal direction (X direction), and the plurality of third conductive patterns 431 of the third interconnect layer LY3 may extend in the first horizontal direction (X direction). In some embodiments, the plurality of conductive patterns (i.e., the plurality of first conductive patterns 411 and the plurality of second conductive patterns 415) of the first interconnect layer LY1b, the plurality of power mesh patterns (i.e., the plurality of first power mesh patterns 421 and the plurality of second power mesh patterns 425) of the second interconnect layer LY2a, and the plurality of third conductive patterns 431 of the third interconnect layer LY3 may extend in the same direction (e.g., first horizontal direction (X direction)).

In the semiconductor package 12, the first semiconductor chip 100b and the second semiconductor chip 200 may be configured to receive power signals through different electrical paths. The first semiconductor chip 100b may be configured to receive the first power signal through an electrical path including the plurality of first power external connection terminals 311, the plurality of first conductive patterns 411 of the first interconnect layer LY1b, the plurality of first through electrodes 171, and the first power mesh patterns 421 of the second interconnect layer LY2a. The second semiconductor chip 200 may be configured to receive the second power signal through an electrical path including the plurality of second power external connection terminals 315, the plurality of second conductive patterns 415 of the first interconnect layer LY1b, the plurality of second through electrodes 175, the plurality of second power mesh patterns 425 of the second interconnect layer LY2a, the plurality of third conductive patterns 431 of the third interconnect layer LY3, the plurality of connection bumps 330, and the plurality of bump pads 441 of the fourth interconnect layer LY4.

In some embodiments, the plurality of first through electrodes 171 may be regularly arranged in the first horizontal direction (X direction) and the second horizontal direction (Y direction), and the plurality of first power external connection terminals 311 may be regularly arranged in the first horizontal direction (X direction) and the second horizontal direction (Y direction).

The plurality of first through electrodes 171 may be arranged to have an X5 pitch distance PX5 in the first horizontal direction (X direction) and a Y5 pitch distance in the second horizontal direction (Y direction), and the plurality of first power external connection terminals 311 may be arranged to have an X6 pitch distance PX6 in the first horizontal direction (X direction) and a Y6 pitch distance in the second horizontal direction (Y direction). The X6 pitch distance PX6 of the first power external connection terminals 311 may be the same as the X4 pitch distance (PX4 in FIG. 7) of the second power external connection terminals 315, and the Y6 pitch distance of the first power external connection terminals 311 may be the same as the Y4 pitch distance (PY4 of FIG. 7) of the second power external connection terminals 315.

In some embodiments, the X5 pitch distance PX5 of the first through electrodes 171 in the first horizontal direction (X direction) may be T times (T is a natural number) the X6 pitch distance PX6 of the first power external connection terminals 311 in the first horizontal direction (X direction), and the Y5 pitch distance of the first through electrodes 171 in the second horizontal direction (Y direction) may be U times (U is a natural number) the Y6 pitch distance of the first power external connection terminals 311 in the second horizontal direction (Y direction). In some embodiments, the X5 pitch distance PX5 of the first through electrodes 171 in the first horizontal direction (X direction) may be the same as the X6 pitch distance PX6 of the first power external connection terminals 311 in the first horizontal direction (X direction). In some embodiments, the Y5 pitch distance of the first through electrodes 171 in the second horizontal direction (Y direction) may be the same as the Y6 pitch distance of the first power external connection terminals 311 in the second horizontal direction (Y direction).

The plurality of first through electrodes 171 and the plurality of first power external connection terminals 311 may be arranged not to overlap each other in the vertical direction (Z direction). In some embodiments, in a plan view, the first power external connection terminal 311 may not be positioned between two adjacent first through electrodes 171 in the first horizontal direction (X direction). For example, in a plan view, the plurality of first power external connection terminals 311 may be spaced apart from a straight line connecting the centers of the two adjacent first through electrodes 171 in the first horizontal direction (X direction). According to another embodiment, in a plan view, the centers of the plurality of first power external connection terminals 311 may be spaced apart from a straight line connecting centers of two adjacent first through electrodes 171 in the first horizontal direction (X direction).

In some embodiments, in a plan view, one first through electrode 171 may be located on the center point of four adjacent first power external connection terminals 311 in two diagonal directions perpendicular to each other (i.e., directions diagonal to the first horizontal direction (X direction) and the second horizontal direction (Y direction)). According to another embodiment, in a plan view, one first power external connection terminal 311 may be located on the center point of four adjacent first through electrodes 171 in two diagonal directions perpendicular to each other (i.e., directions diagonal to the first horizontal direction (X direction) and the second horizontal direction (Y direction)).

A plurality of first through electrodes 171, among the plurality of first through electrodes 171, arranged along a first straight line parallel to the first horizontal direction (X direction) to form one row may be defined as a first group of first through electrodes 171. The first group of first through electrodes 171 may be electrically connected to one first power mesh pattern 421 and may overlap one first power mesh pattern 421 in the vertical direction (Z direction). According to another embodiment, a plurality of first power external connection terminals 311, among the plurality of first power external connection terminals 311, arranged along a second straight line parallel to the second horizontal direction (Y direction) to form one column may be defined as a first group of first power external connection terminals 311. The first group of first power external connection terminals 311 may be electrically connected to a first conductive pattern 411 and may overlap the first conductive pattern 411 in the vertical direction. In a plan view, each of the plurality of first power external connection terminals 311 may be spaced apart in the second horizontal direction (Y direction) from a straight line connecting the first group of first through electrodes 171 to form one row.

Figure 13:
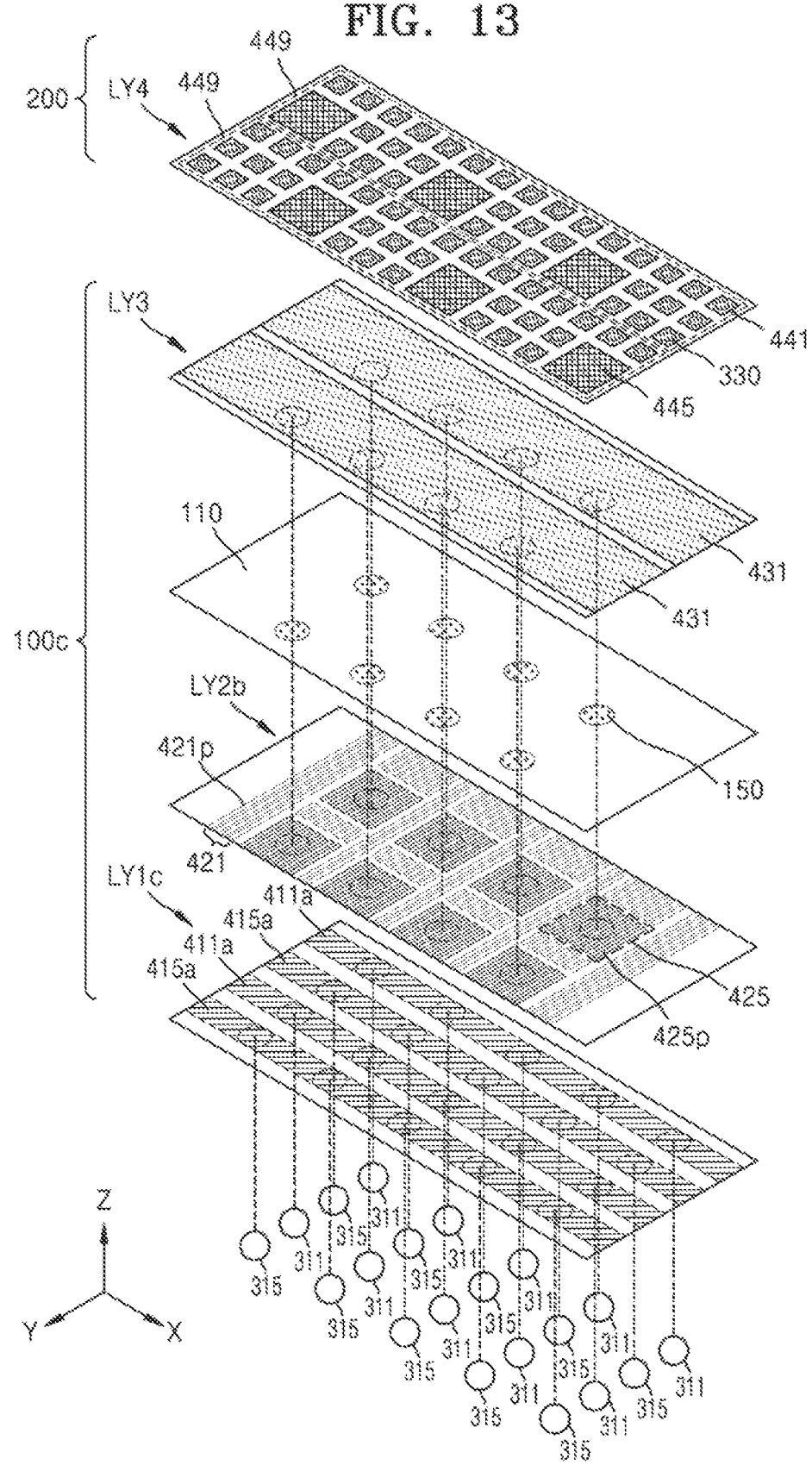
FIG. 13 is a configuration diagram illustrating a semiconductor package according to some embodiments.

FIG. 13 is a configuration diagram illustrating a semiconductor package according to some embodiments. Hereinafter, the semiconductor package shown in FIG. 13 will be described, focusing on differences from the semiconductor package 10 described with reference to FIGS. 1 and 2.

Referring to FIG. 13, in a first semiconductor chip 100c of the semiconductor package, the plurality of conductive patterns of the first interconnect layer LY1c (e.g., a plurality of first conductive patterns 411a and a plurality of second conductive patterns 415a) may extend in the first horizontal direction (X direction), and the plurality of power mesh patterns (e.g., a plurality of first power mesh patterns 421 and a plurality of second power mesh patterns 425) of the second interconnect layer LY2b may extend in the second horizontal direction (Y direction).

In some embodiments, the second interconnect layer LY2b may include a plurality of first pattern regions provided with the plurality of first power mesh patterns 421 and a plurality of second pattern regions provided with the plurality of second power mesh patterns 425. The plurality of second pattern regions may be spaced apart from each other in the first horizontal direction (X direction) and/or the second horizontal direction (Y direction), and each second pattern region may be surrounded by the first pattern regions having the first power mesh patterns 421. In a plan view, the second power mesh patterns 425 provided in each second pattern region may be between the first power mesh patterns 421 in the first horizontal direction (X direction) and between the first power mesh patterns 421 in the second horizontal direction (Y direction). For example, there may be the first power mesh pattern 421 between two second pattern regions spaced apart in the first horizontal direction (X direction) among the plurality of second pattern regions, and there may be the first power mesh pattern 421 between two second pattern regions spaced apart in the second horizontal direction (Y direction) among the plurality of second pattern regions.

Figure 14:
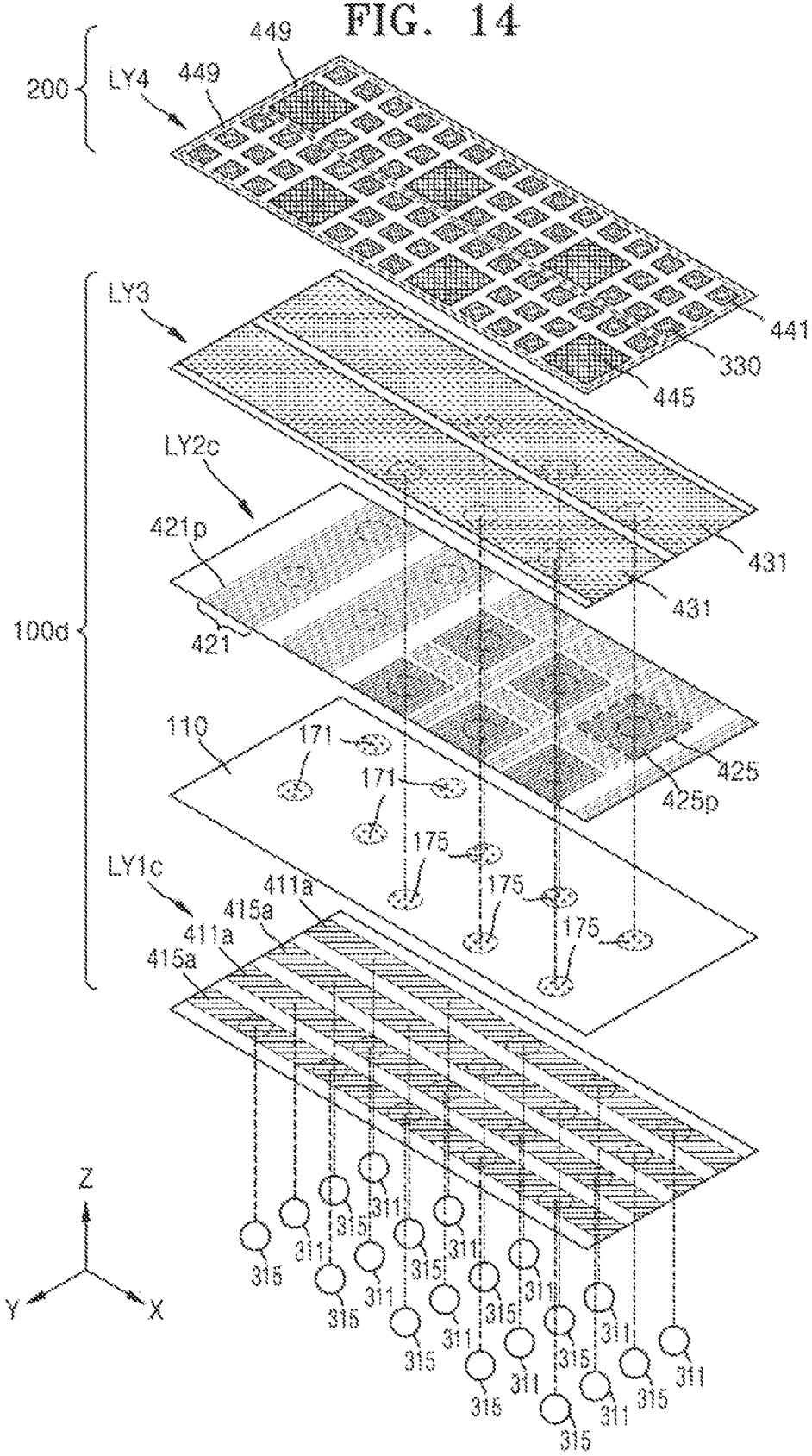
FIG. 14 is a configuration diagram illustrating a semiconductor package according to some embodiments.

FIG. 14 is a configuration diagram illustrating a semiconductor package according to some embodiments. Hereinafter, the semiconductor package shown in FIG. 14 will be described, focusing on differences from the semiconductor package 12 described with reference to FIGS. 11 and 12.

Referring FIG. 14, in the first semiconductor chip 100d of the semiconductor package, the plurality of conductive patterns (e.g., the plurality of first conductive patterns 411a and the plurality of second conductive patterns 415a) of the first interconnect layer LY1a may extend in the first horizontal direction (X direction), and the plurality of power mesh patterns (e.g., the plurality of first power mesh patterns 421 and the plurality of second power mesh patterns 425) of the second interconnect layer may extend in the second horizontal direction (Y direction).

In some embodiments, the second interconnect layer LY2c may include a plurality of first pattern regions provided with the plurality of first power mesh patterns 421 and a plurality of second pattern regions provided with the plurality of second power mesh patterns 425. The plurality of second pattern regions may be spaced apart in the first horizontal direction (X direction) and/or the second horizontal direction (Y direction), and each second pattern region may be surrounded by the first pattern regions having the first power mesh patterns 421. In a plan view, the second power mesh patterns 425 provided in each second pattern region may be between the first power mesh patterns 421 in the first horizontal direction (X direction) and between the first power mesh patterns 421 in the second horizontal direction (Y direction). In other words, there may be the first power mesh patterns 421 between two second pattern regions spaced apart in the first horizontal direction (X direction) among the plurality of second pattern regions, and there may be the first power mesh patterns 421 between two second pattern regions spaced apart in the second horizontal direction (Y direction) among the plurality of second pattern regions.

In some embodiments, the plurality of first power mesh patterns 421 may be electrically connected to the conductive patterns provided on the third interconnect layer LY3. For example, the third interconnect layer LY3 may further include fourth conductive patterns parallel to the third conductive patterns 431, and the plurality of first power mesh patterns 421 may be connected to the fourth conductive patterns of the third interconnect layer LY3. The fourth conductive patterns of the third interconnect layer LY3 may be configured to transmit the first power signal supplied to devices of the first semiconductor chip 100d, and form a power distribution network for the first semiconductor chip 100d.

According to some embodiments, the semiconductor package may have a three-dimensional (3D) stacked structure in which an upper second semiconductor chip is stacked on a lower first semiconductor chip, and the power distribution network for the first semiconductor chip and the power distribution network for the second semiconductor chip may be implemented through circuits of the first semiconductor chip and separated from the first semiconductor chip.

In the semiconductor package having a 3D stacked structure according to some embodiments, a voltage drop may be reduced by regularly arranging bump pads and test pads in the first horizontal direction and the second horizontal direction, and interconnect layers may be designed to have a high pattern density within a limited area by arranging the bump pads and the test pads so that the pitch distance of the test pads to be a multiple of the pitch distance of the bump pads.

In the semiconductor package having a 3D stacked structure according to some embodiments, the electromigration (EM) may be prevented by arranging through electrodes for power and external connection terminals for power to be non-overlapping in a plan view, and designing the pitch distance of through electrodes for power and the pitch distance of external connection terminals for power to have a multiple relationship.

While embodiments have been described with reference to the figures, it will be understood by those of ordinary skill in the art that various changes in form and details may be made therein without departing from the spirit and scope as defined by the following claims and their equivalents.

What is claimed is:

1. A semiconductor package comprising:
   a plurality of first external connection terminals configured to transfer a first power signal and a plurality of second external connection terminals configured to transfer a second power signal;
   a first semiconductor chip configured to receive the first power signal, the first semiconductor chip comprising:
   a first interconnect layer comprising a plurality of first patterns electrically connected to the plurality of first external connection terminals and a plurality of second patterns electrically connected to the plurality of second external connection terminals;
   a second interconnect layer on the first interconnect layer, the second interconnect layer comprising a plurality of first mesh patterns electrically connected to the plurality of first patterns and a plurality of second mesh patterns electrically connected to the plurality of second patterns; and
   a third interconnect layer on the second interconnect layer, the third interconnect layer comprising a third pattern electrically connected to the plurality of second mesh patterns and extending in a first direction;
   a second semiconductor chip configured to receive the second power signal and on the first semiconductor chip, the second semiconductor chip comprising:
   a fourth interconnect layer comprising a plurality of bump pads and a plurality of test pads; and
   a second substrate on the fourth interconnect layer; and
   a plurality of connection bumps between the first semiconductor chip and the second semiconductor chip, the plurality of connection bumps being connected to the plurality of bump pads, respectively,
   wherein bump pads, among the plurality of bump pads, in a pad region of the fourth interconnect layer overlapping the third pattern in a vertical direction are configured to receive power of same potential through the third pattern.

2. The semiconductor package of claim 1, wherein the plurality of bump pads have a first pitch distance in the first direction and a second pitch distance in a second direction perpendicular to the first direction,
   wherein the plurality of test pads have a third pitch distance in the first direction and a fourth pitch distance in the second direction,
   wherein the third pitch distance is N times the first pitch distance, where N is a natural number, and
   wherein the fourth pitch distance is M times the second pitch distance, where M is a natural number.

3. The semiconductor package of claim 1, wherein the first semiconductor chip further comprises:
   a first substrate between the second interconnect layer and the third interconnect layer; and
   a plurality of through electrodes penetrating the first substrate and electrically connecting the plurality of second mesh patterns to the third pattern.

4. The semiconductor package of claim 3, wherein the plurality of through electrodes have a fifth pitch distance in the first direction and a sixth pitch distance in a second direction perpendicular to the first direction,
   wherein the plurality of second external connection terminals have a seventh pitch distance in the first direction and an eighth pitch distance in the second direction,
   wherein the fifth pitch distance is P times the seventh pitch distance, where P is a natural number, and
   wherein the sixth pitch distance is Q times the eighth pitch distance, where Q is a natural number.

5. The semiconductor package of claim 4, wherein the plurality of bump pads are arranged to have an first pitch distance in the first direction,
   wherein the plurality of test pads are arranged to have a second pitch distance in the first direction,
   wherein the second pitch distance is 5 times the first pitch distance,
   wherein the fifth pitch distance is equal to the seventh pitch distance, and
   wherein the seventh pitch distance and the fifth pitch distance are three times the first pitch distance.

6. The semiconductor package of claim 4, wherein the plurality of bump pads are arranged to have a ninth pitch distance in the second direction,
 wherein the plurality of test pads are arranged to have a tenth pitch distance in the second direction, and
 wherein the tenth pitch distance is M times the ninth pitch distance, where M is a natural number.

7. The semiconductor package of claim 4, wherein the plurality of second external connection terminals and the plurality of through electrodes do not overlap each other in the vertical direction.

8. The semiconductor package of claim 7, wherein the plurality of through electrodes comprise a first group of through electrodes provided parallel to the first direction to form one row, and
 wherein each of the plurality of second external connection terminals is spaced apart in the second direction from a straight line connecting two adjacent through electrodes in the first direction among the first group of through electrodes.

9. The semiconductor package of claim 1, wherein each of the plurality of first mesh patterns comprises a plurality of first unit line patterns extending in the first direction, and
 wherein each of the plurality of second mesh patterns comprises a plurality of second unit line patterns extending in the first direction.

10. The semiconductor package of claim 9, wherein each of the plurality of first patterns and each of the plurality of second patterns extend in a second direction perpendicular to the first direction.

11. The semiconductor package of claim 9, wherein each of the plurality of first patterns and each of the plurality of second patterns extend in the first direction.

12. The semiconductor package of claim 9, wherein a ratio of power consumption of the first semiconductor chip to power consumption of the second semiconductor chip is same as a ratio of a number of first unit line patterns included in the plurality of first mesh patterns to a number of second unit line patterns included in the plurality of second mesh patterns.

13. The semiconductor package of claim 1, wherein a ratio of power consumption of the first semiconductor chip to power consumption of the second semiconductor chip is same as a ratio of a number of the plurality of first external connection terminals to a number of the plurality of second external connection terminals.

14. The semiconductor package of claim 1, wherein the first semiconductor chip further comprises:
 a first substrate between the first interconnect layer and the second interconnect layer;
 a plurality of first through electrodes penetrating the first substrate and electrically connecting the plurality of first patterns to the plurality of first mesh patterns; and
 a plurality of second through electrodes penetrating the first substrate and electrically connecting the plurality of second patterns to the plurality of second mesh patterns.

15. A semiconductor package comprising:
 a plurality of first external connection terminals configured to transfer a first power signal and a plurality of second external connection terminals configured to transfer a second power signal;
 a first semiconductor chip configured to receive the first power signal, the first semiconductor chip comprising:
  a first interconnect layer comprising a plurality of first patterns electrically connected to the plurality of first external connection terminals and a plurality of second patterns electrically connected to the plurality of second external connection terminals,
  a second interconnect layer on the first interconnect layer, the second interconnect layer comprising a plurality of first mesh patterns electrically connected to the plurality of first patterns and a plurality of second mesh patterns electrically connected to the plurality of second patterns,
  a first substrate on the second interconnect layer;
  a plurality of through electrodes penetrating the first substrate and electrically connected to the plurality of second mesh patterns; and
  a third interconnect layer on the first substrate, the third interconnect layer comprising a third pattern electrically connected to the plurality of second mesh patterns through the plurality of through electrodes and extending in a first direction;
 a second semiconductor chip configured to receive the second power signal and on the first semiconductor chip, the second semiconductor chip comprising:
  a fourth interconnect layer comprising a plurality of bump pads and a plurality of test pads: and
  a second substrate on the fourth interconnect layer; and
 a plurality of connection bumps between the first semiconductor chip and the second semiconductor chip, the plurality of connection bumps being connected to the plurality of bump pads, respectively,
 wherein the plurality of through electrodes have a first pitch distance in the first direction,
 wherein the plurality of second external connection terminals have a second pitch distance in the first direction, and
 wherein the first pitch distance is P times the second pitch distance, where P is a natural number.

16. The semiconductor package of claim 15, wherein the plurality of second external connection terminals and the plurality of through electrodes do not overlap each other in a vertical direction,
 wherein the plurality of through electrodes comprise a first group of through electrodes provided parallel to the first direction to form one row,
 wherein each of the plurality of second external connection terminals is spaced apart in a second direction perpendicular to the first direction from a straight line connecting two adjacent through electrodes among the first group of the through electrodes.

17. The semiconductor package of claim 15, wherein the plurality of bump pads have a third pitch distance in the first direction,
 wherein the plurality of test pads have a fourth pitch distance in the first direction, and
 wherein the fourth pitch distance is N times the third pitch distance, where N is a natural number.

18. The semiconductor package of claim 15, wherein each of the plurality of first mesh patterns comprises a plurality of first unit line patterns extending in the first direction,
 wherein each of the plurality of second mesh patterns comprises a plurality of second unit line patterns extending in the first direction, and
 wherein each of the plurality of first patterns and each of the plurality of second patterns extend in a second direction perpendicular to the first direction.

19. The semiconductor package of claim 15, wherein each of the plurality of first mesh patterns comprises a plurality of first unit line patterns extending in the first direction, wherein each of the plurality of second mesh patterns comprises a plurality of second unit line patterns extending in the first direction, and wherein each of the plurality of first patterns and each of the plurality of second patterns extend in the first direction.

20. A semiconductor package comprising:
a plurality of first external connection terminals configured to transfer a first power signal and a plurality of second external connection terminals configured to transfer a second power signal;
a first semiconductor chip configured to receive the first power signal, the first semiconductor chip comprising:
  a first interconnect layer comprising a plurality of first patterns electrically connected to the plurality of first external connection terminals and a plurality of second patterns electrically connected to the plurality of second external connection terminals;
  a second interconnect layer on the first interconnect layer, the second interconnect layer comprising a plurality of first mesh patterns electrically connected to the plurality of first patterns and a plurality of second mesh patterns electrically connected to the plurality of second patterns, the plurality of first mesh patterns and the plurality of second mesh patterns extending in a first direction;
  a first substrate on the second interconnect layer;
  a plurality of through electrodes penetrating the first substrate, electrically connected to the plurality of second mesh patterns, and electrically insulated from the plurality of first mesh patterns; and
  a third interconnect layer on the first substrate, the third interconnect layer comprising a third pattern electrically connected to the plurality of second mesh patterns through the plurality of through electrodes and extending in the first direction;
a second semiconductor chip configured to receive the second power signal and on the first semiconductor chip, the second semiconductor chip comprising:
  a fourth interconnect layer comprising a plurality of bump pads and a plurality of test pads; and
  a second substrate on the fourth interconnect layer; and
a plurality of connection bumps between the first semiconductor chip and the second semiconductor chip, the plurality of connection bumps being connected to the plurality of bump pads, respectively,
wherein bump pads, among the plurality of bump pads, in a pad region of the fourth interconnect layer overlapping the third pattern in a vertical direction are configured to receive power of same potential through the third pattern,
wherein the plurality of bump pads have a first pitch distance in the first direction,
wherein the plurality of test pads have a second pitch distance in the first direction,
wherein the second pitch distance is N times the first pitch distance,
wherein the plurality of through electrodes have a third pitch distance in the first direction,
wherein the plurality of second external connection terminals have a fourth pitch distance in the first direction,
wherein the third pitch distance is P times the fourth pitch distance, where P is a natural number,
wherein the plurality of through electrodes comprise a first group of through electrodes provided parallel to the first direction to form one row, and
wherein each of the plurality of second external connection terminals is spaced apart in a second direction perpendicular to the first direction from a straight line connecting two adjacent through electrodes among the first group of through electrodes.

* * * * *